United States Patent [19]

Cannon et al.

[11] Patent Number: 4,816,767
[45] Date of Patent: Mar. 28, 1989

[54] VECTOR NETWORK ANALYZER WITH INTEGRAL PROCESSOR

[75] Inventors: Wayne C. Cannon, Forestville; John T. Barr, IV, Santa Rosa, both of Calif.

[73] Assignee: Hewlett-Packard Company, Palo Alto, Calif.

[21] Appl. No.: 907,124

[22] Filed: Sep. 11, 1986

Related U.S. Application Data

[63] Continuation of Ser. No. 568,991, Jan. 9, 1984, abandoned.

[51] Int. Cl.$^4$ ............................................. G01R 27/04
[52] U.S. Cl. .............................. 324/58 R; 324/77 B; 364/571.04
[58] Field of Search ................ 364/571, 483, 484, 485; 324/77 CS, 77 B, 77 C, 57 R, 57 SS, 58 A, 58 B, 58 R, 58.5 A, 58.5 B, 58.5 R

[56] References Cited

U.S. PATENT DOCUMENTS

| | | |
|---|---|---|
| 3,904,959 | 9/1975 | Britton, Jr. |
| 4,103,223 | 7/1978 | Weinert .............................. 324/57 R |
| 4,104,583 | 8/1978 | Engen ................................ 324/58 R |
| 4,361,801 | 11/1982 | Meyer ............................. 324/58.5 R |
| 4,680,538 | 7/1987 | Dalman ............................ 324/58 A |

OTHER PUBLICATIONS

HP catalog-1983 edition—p. 455.
Weinert: "A Dual-Channel Vector Ratio Meter"—Conference on MW Measurements—Loudon—UK—May 1981—(6 pages).
Weinert: "A 1-18 GHZ Attenuator Calibrator"—IEEE Trans. on Instrum., Dec. 1976—pp. 298-306.
Winston: "A 5 MHZ Spectrum Analyzer"—Tekscope—vol. 7, No. 3 (1975).

Primary Examiner—Reinhard J. Eisenzopf
Assistant Examiner—Jose M. Solis
Attorney, Agent, or Firm—Jeffery B. Fromm; William C. Milks, III

[57] ABSTRACT

An RF network analyzer is disclosed which is suitable for both laboratory and automated production measurements. An important feature of the invention is the ability of the user to completely specify the method of calibration to be used. In particular the user can select any three arbitrary RF standards having known electromagnetic response characteristics and can attach them in any arbitrary order to perform the calibration of the instrument. This calibration is carried out by measuring the RF scattering parameters $S_{11}$, $S_{21}$, $S_{12}$, and $S_{22}$, storing the data in a memory, and then calculating vector error correction coefficients that are characteristic of systematic errors introduced by the RF network analyzer into measured scattering parameters.

3 Claims, 20 Drawing Sheets

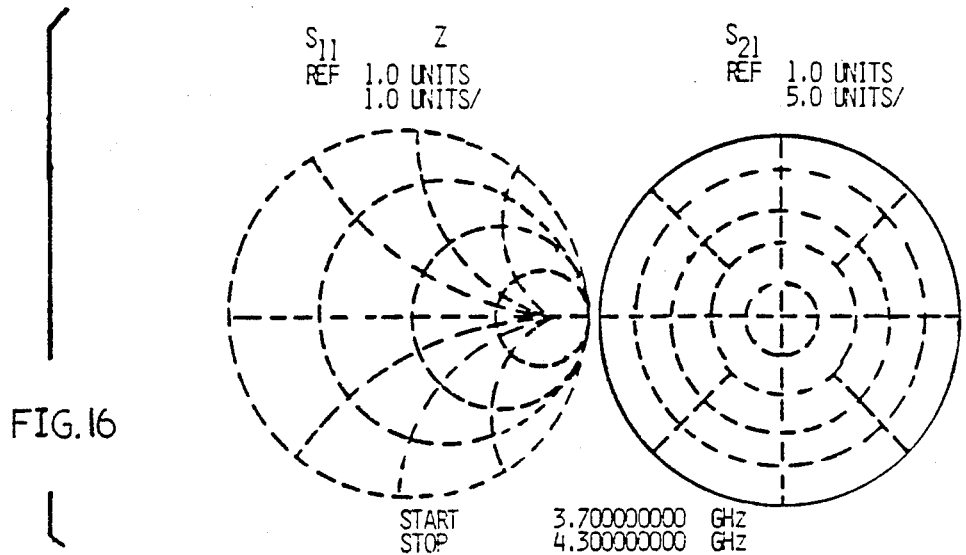
FIG. 16
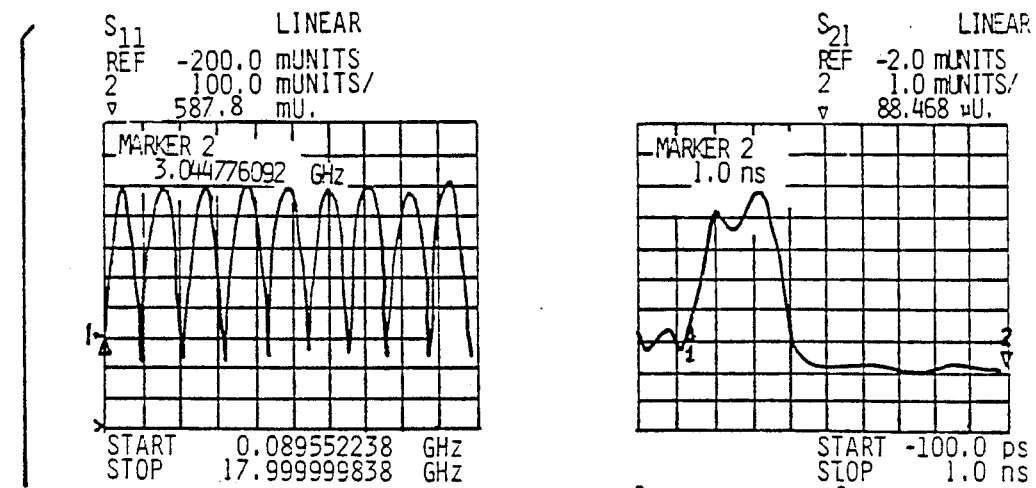
FIG. 17
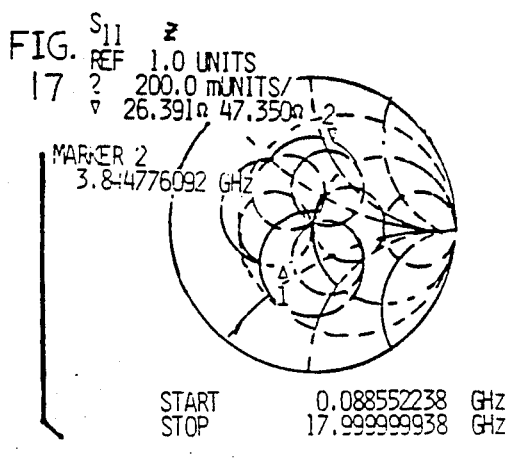
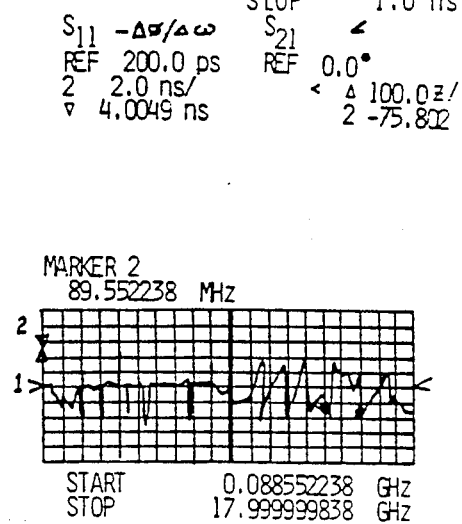

VECTOR NETWORK ANALYZER WITH INTEGRAL PROCESSOR

BACKGROUND OF THE INVENTION

Formerly, most magnitude and phase vector measurements at microwave frequencies have been performed by network analyzers using techniques such as those described in "Automatic Network Analyzer 8542A, Section IV Network Analyzer Fundamentals", Hewlett-Packard Co. 1969 and in U.S. Pat. No. 4,244,024 issued Jan. 6, 1981 by Marzalek et al. Such vector network analyzers characterize networks, including devices, components, and systems by measuring the magnitude and phase of the network's transmission and reflection coefficients versus frequency. The capability to measure group delay, a special form of transmission and also usable in reflection, is also often incorporated in a vector network analyzer.

In general, a vector network analysis measurement system contains several separate modules. First is an RF source to provide the stimulus to the device under test (DUT). The stimulus normally covers a limited range of frequencies, either in a continuous analog sweep, referred to as the swept mode, in discrete steps, referred to as the step mode, or a single point mode. Second is a signal separation network to route the stimulus to the DUT and provide a means for sampling the energy that is reflected from, or transmitted through, the DUT. Also, energy is sampled from the signal that is incident upon the DUT in order to provide a reference for all relative measurements. Third is a tuned receiver to convert the resulting signals to an intermediate frequency (IF) for further processing. The magnitude and phase relationships of the original signals must be maintained through the frequency conversion to IF to provide usable measurements. Fourth is a detector to detect the magnitude and phase characteristics of the IF signals, and fifth is a display on which to present the measurement results.

To improve measurement accuracy, a set of "standard" devices with known characteristics can be measured by a computer controlled system. From this data, a set of complex equations can be solved to determine a model representing many of the errors associated with the network analyzer process. This model is then stored in the computer and later when unknown devices are measured, the model can be used to separate the actual data from the "raw" measured data to provide enhanced accuracy in the microwave measurement by a process known as vector error correction.

Accuracy enhancement is very important in microwave measurements because even with the best signal generating and separating devices manufactured to state of the art tolerances, relatively large errors still occur as compared to low frequency measurements. For example, without vector error correction, a typical vector measuring system will yield errors of 30 percent. If one is willing to forego either the phase or impedance measurement of the unknown device, a modern scalar network analyzer is still only able to reduce the errors to 10 percent. On the other hand with prior implementations of vector error correction, errors can be reduced to about one percent.

Unfortunately, several significant problems remain with prior "automatic" network analyzers: they are very slow in the error correction mode; the systems are often quite awkward to use; they are unable to automatically perform a fully errorcorrected measurement of forward and reverse reflection and transmission parameters (e.g., $S_{11}$, $S_{12}$, $S_{21}$, and $S_{22}$); and, broadband vector testing from RF to millimeter bands (e.g., 45 MHz to 26.5 GHz) cannot be performed with high accuracy and resolution without multiple manual reconnections.

Finally, in prior systems the data is usually displayed and analyzed only in the frequency domain, requiring either the use of a separate instrument such as a time domain reflectometer (TDR) in order to directly measure the response of the DUT as a function of time, or a powerful external computer coupled to the network analyzer to take data in the frequency domain and then perform an inverse Fourier conversion using either a truncated Fourier series or the faster Cooley-Tukey algorithm or others. Although the traditional TDR approach is fairly fast, the signal to noise ratio is low and the method is susceptible to both jitter and baseline drift. Conversely, although former computer coupled network analyzers exhibit significant improvements over the TDR method in signal to noise ratio, jitter, and drift, these systems are very slow, requiring several minutes to provide a time domain analysis and display of a DUT.

SUMMARY OF THE INVENTION

The present invention overcomes many of the limitations of the prior art by permitting automatic, high speed, and accurate measurement of the device characteristics of a DUT across a broadband of microwave frequencies. A fully error corrected measurement of four vector transmission and reflection parameters is accomplished in "real time" with the ability to analyze and display over 400 frequency points in less than one second. This speed permits the operator for the first time to view the effects of adjustments on the network under test while performing measurements with high precision. At the same time, measurement accuracies are achieved that are more than ten times as precise than have previously been attainable with commercially available instrumentation. In addition, vector testing using a single set up of a DUT can for the first time be performed across a broadband frequency range from RF to millimeter bands. Although many factors affect overall measurement accuracy, including operator technique, dynamic accuracies of 0.05 dB in magnitude and 0.3 degrees in phase can be accomplished for a device with 50 dB of insertion loss. An overall dynamic range of 100 dB, resolutions of 0.001 dB in magnitude, 0.01 degrees in phase, and 10 picoseconds in group delay, and corresponding measurement stabilities are attained depending on the particular frequency range and test set used. Further, error corrected data can be transformed between the frequency and time domains in real time without sacrificing accuracy or resolution, and can be displayed on a single cathode ray tube (CRT), plotter or other display either in the frequency domain, the time domain, or in both domains at the same time.

The time domain Fourier transforms in the present invention permit the operator to see the response of the DUT as a function of time from the application of the stimulus. While the frequency domain response of the DUT is the integrated response over the test frequency range, the time domain response presents the individual responses as a function of distance, permitting identification of specific discontinuities within the DUT and/or the test set. Responses can then be isolated within settable "gates", making it possible to virtually ignore responses outside of the gates. A response within the gate can then be transformed back into the frequency domain if so desired. It thus is possible to "gate out" measurement system responses from cables, connectors, and fixtures to measure the DUT alone. In addition, time domain data are computed at speeds similar to those of frequency domain measurements, providing the same "real time" capability, flexibility, and convenience. Also, since the time domain data are computed from the error corrected S-parameter measurements, the result is that both time and frequency data have similar accuracies.

Major elements of the present invention are the main analyzer containing the IF, signal processing, internal computing, and display circuitry, plus the operating panel used to select functions and control the entire measurement system; an RF test set and microwave to IF frequency conversion unit; and a source for test signals, such as a synthesized or swept oscillator with the desired frequency coverage. A dedicated interface between the main analyzer and the source is provided to facilitate the necessary control functions and data exchanges (handshakes) so that all source controls and monitoring can be performed from the main analyzer. Several test sets which incorporate broadband signal separation devices, balanced broadband power splitters, and high coversion efficiency samplers with flat frequency response and low crosstalk, are provided for optimized performance for different frequency ranges and connector types. A dedicated interface provides control from the main analyzer.

The main analyzer is a microprocessor based instrument that performs the signal processing and all computation associated with error correction, data formatting, and transformations. A variety of display modes are provided including log and linear magnitude versus either frequency or time, linear phase, deviation from linear phase, group delay versus frequency, standard Smith Chart, compressed Smith Chart, expanded Smith Chart, inverted Smith Charts, and "Bull's Eye" polar chart. A variety of marker read out formats are also provided. Examples of the display flexibility provided include a split screen CRT with two independent formats or two responses overlaid on a common format. In addition, any or all of the CRT displays can be directly transferred to a digital printer or plotter without need of an external computer.

The main analyzer's control panel uses a number of buttons arranged in a unique hierarchal structure to specify the complete measurement process. Several control buttons are dedicated for functions most commonly used in typical measurement applications, while less common functions are available through a series of logical menus which are accessed via several "softkeys" under control of internal firmware. Altogether, over 70 menus with over 320 functions can be reached by means of the softkeys to provide a wide range of microwave network measurements.

A particularly important feature of the invention that is made possible by the above unique combination of software and hardware is the ability of the user to completely specify the method of calibration to be used. In particular the user can select any three arbitrary RF standards having known electromagnetic response characteristics, and can attach them in any arbitrary order to perform the calibration of the instrument. This calibration is carried out by measuring the RF scattering parameters $S_{11}$, $S_{21}$, $S_{12}$, and $S_{22}$, storing the data in a memory, and then calculating vector error correction coefficients that are chracteristic of systematic errors introduced by the RF network analyzer into measured scattering parameters. Thus the user is freed from having to use a particular calibration set and from having to follow a particular order of attachment as in the prior art in order to perform the calibration. This "user friendly" characteristic is just one of the many features of the instrument that allow the RF engineer to concentrate on the measurement job at hand instead of being constrained by the measurement instrument.

DESCRIPTION OF THE DRAWINGS

FIGS. 5 through 14, 16, and 17 show several of the measurements which can be performed wtih the preferred embodiment of the present invention.

DETAILED DESCRIPTION OF THE INVENTION

Description of the Block Diagram

Figure 1A:
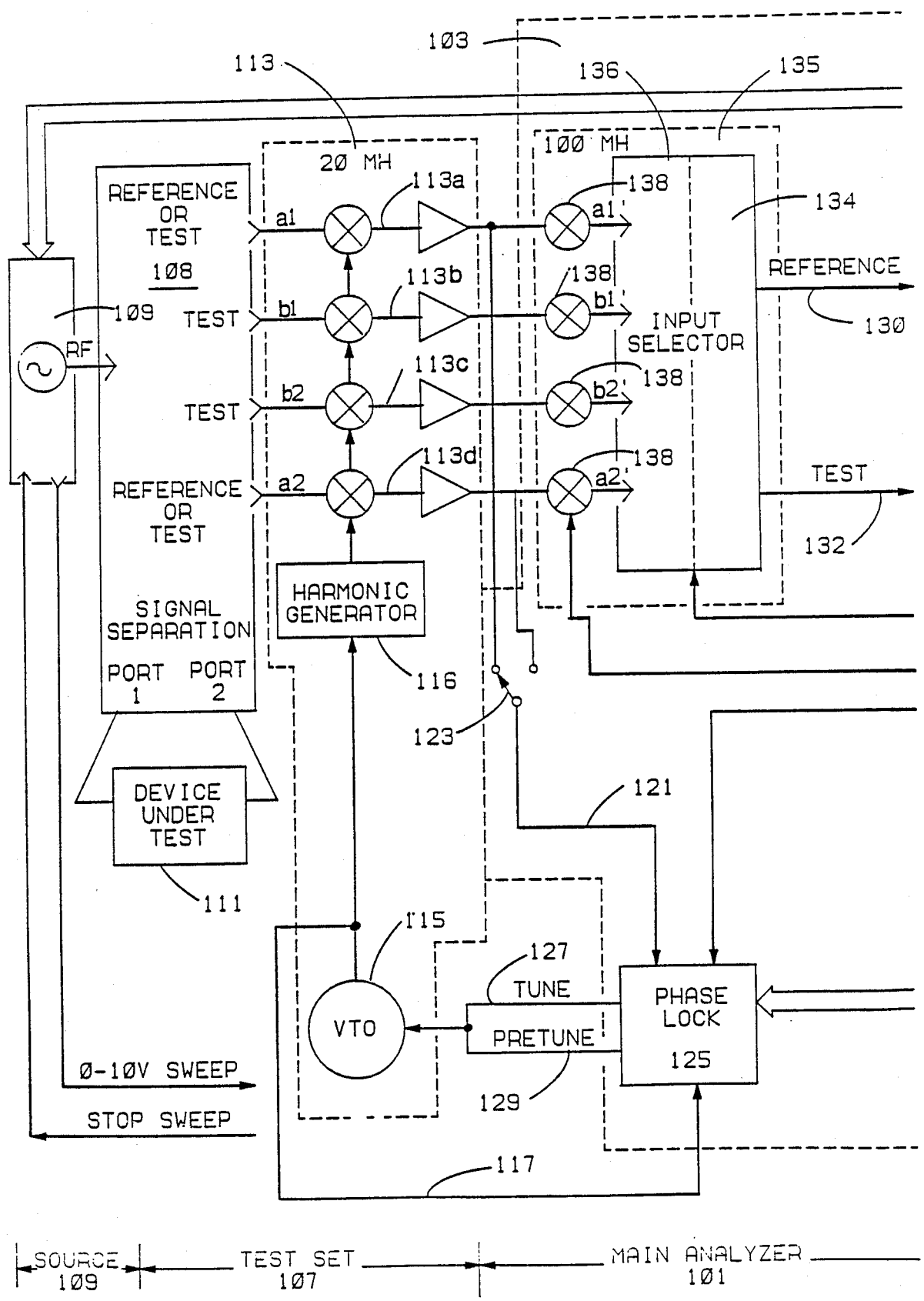
FIGS. 1A and 1B shows a simplified block diagram of the preferred embodiment of the present invention.
Figure 1B:
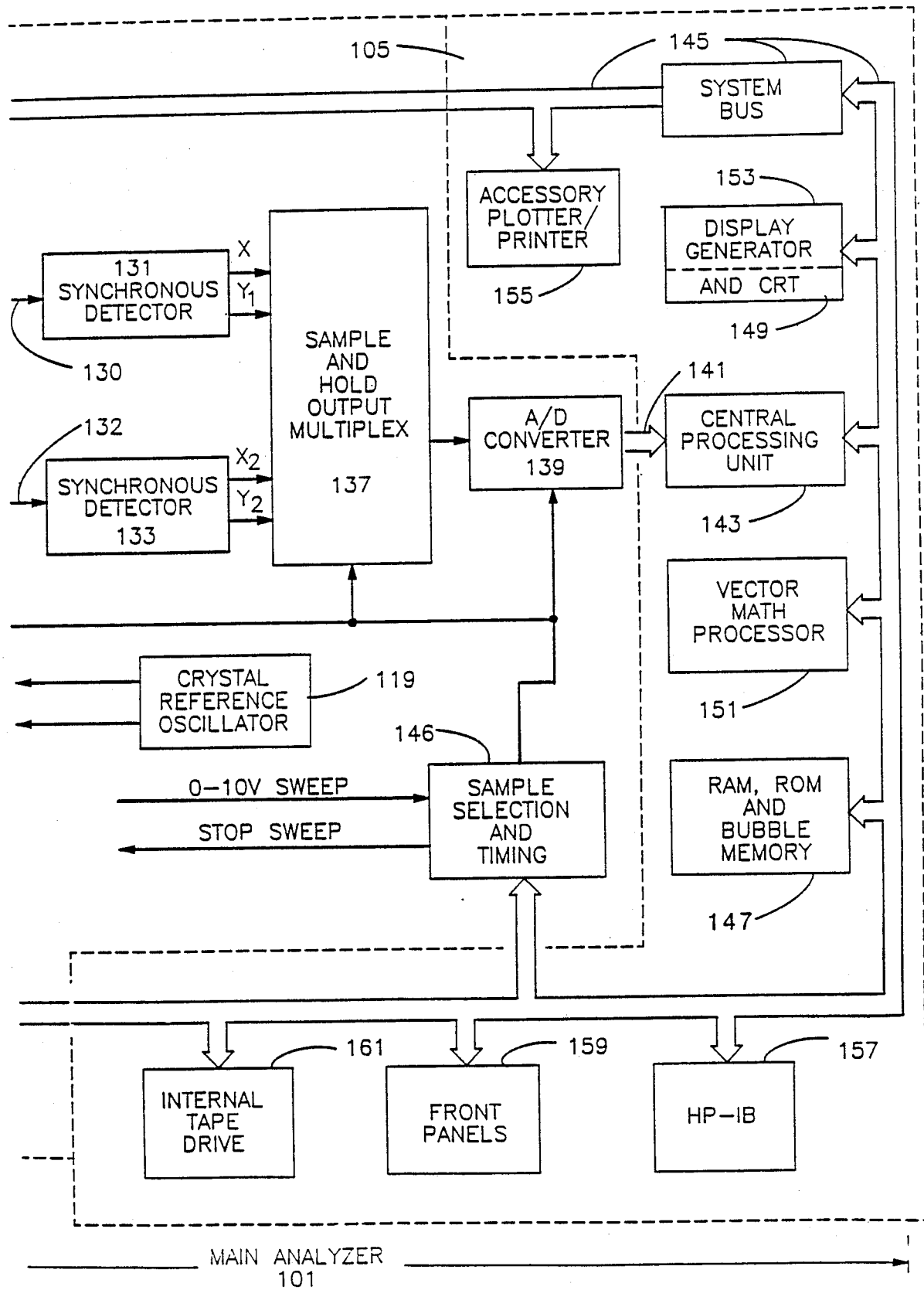

Shown in FIGS. 1A and 1B is a block diagram of the preferred embodiment. The measurement system consists first of a main network analyzer 101 with a second IF/detector section 103 and a data processor/display section 105. The main network analyzer 101 is fed by one of four configured test sets 107 which provide the signal separation circuitry 108 and first IF frequency conversion circuitry 113 for reflection/transmission (one incident signal) or S-parameter (two incident signals) measurements up to either 18 or 26.5 GHz. The frequency converter 113 alone is also available to permit the addition of user supplied signal separation devices 108 for specially configured test needs. The third main component of the measurement system is a compatible RF source 109 such as an HP 8340A synthesized sweeper, available from the Hewlett-Packard Co., Palo Alto, Calif., which can be used in either a stepped frequency mode, in which synthesizer class frequency accuracy and repeatability can be obtained by phase locking the source 109 at each of the over 400 frequency steps over the frequency range selected by the main analyzer 101 or the swept frequency mode for applications where extreme frequency range, high stability, and spectral purity are important such as in narrow band measurements over sweeps of less than 5 MHz. An HP 8350B sweeper with HP 83500 series RF plug-ins covering the entire desired frequency range or with lesser spans can also be used in applications where a more economical source is sufficient. Both the HP 8340A and the HP 8350B include the necessary analog interface signals as well as full digital handshake compatibility with the main analyzer 101. This digital handshake compatibility allows the main analyzer 101 to act as the controller for the entire system by directly managing the source 109 to provide all of the inputs such as start frequency, stop frequency, centering, span, and modulation, as well as constraints that the source 109 normally places on itself internally. For example, if a user by means of the main analyzer 101 requests the source 109 to sweep to an incompatible frequency such as 50 GHz, the source 109 will respond to the main analyzer 101 that such a frequency cannot be accommodated and the main analyzer 101 in turn informs the user of the situation. Therefore, the user need only be concerned with his interface to the main analyzer 101 and can use any source 109 that has implemented the required handshake protocols. Because the main analyzer 101 is in control of the source 109, it is also possible to automatically select a different frequency range or mode (stepped or swept) to be applied to each of the ports 1 and 2.

Integrated within each test set 107 is the first IF frequency converter 113 with the three channels 113a, 113b, and 113c for reflection/transmission measurements and four channels 113a, 113b, 113c, and 113d for S-parameter measurements. RF to IF conversion is achieved through a sampling technique equivalent to harmonic mixing. An harmonic of a tunable local oscillator 115 is produced by an harmonic generator 116 to mix with the incoming RF signal to provide the first IF signal at 20 MHz for the incident signal a1 on the input port 1, the incident signal a2 on the output port 2, the reflected or transmitted signal b1 on the input port 1, and the reflected or transmitted signal b2 on the output port 2. Frequency tuning for the local oscillator 115 is controlled by a phase lock loop 117 that compares the signal a1 or a2 in the reference channel first IF to an IF reference oscillator 19 in the IF/detector section 103. Any difference between the frequency of the signal a1 or a2 in the reference channel first IF and the IF reference oscillator 119 results in an error voltage on the error voltage signal line 121 via switch 123 that tunes the local oscillator 115 to the frequency that produces the desired first IF. Switch 123 is toggled to select the most appropriate signal a1 or a2 to lock on to based either on internal criteria within the system or as defined by the user. When using the internal criteria, if the incident signal port is port 1, a1 is selected by switch 123, and if the incident signal port is port 2, a2 is selected by switch 123. This scheme allows the local oscillator 115 to track the incoming RF when the RF frequency is changing with time as in the swept mode. The integrated test set 107 permits high RF to first IF conversion efficiency even at 26.5 GHz, making possible both high sensitivity and wide dynamic range measurements. The test set architecture eliminates the extensive RF switching needed in previous test sets, removing the significant uncertainties caused by the lack of repeatability of mechanical switches. The reflection/transmission test sets 107 require no internal switching since the fourth channel 113d is not required, and the S-parameter test sets 107 use only one electronic PIN diode switch located inside of the test set 108 such that is cannot contribute to uncertainties as it is switched prior to the ratio node of the power splitter.

Several new concepts have been incorporated in the IF/detector section 103 of the main analyzer 101 to increase the precision of IF processing and signal detection. Most of the phase lock hardware 125 in the phase lock loop resides in this section 103. Harmonic mixing number and local oscillator pretuning are controlled digitally via lines 127 and 129 and offer phase lock and tracking performance that is precisely repeatable from sweep to sweep. Before the first IF signals proportional to a1, a2, b1, and b2 are sent to the synchronous detectors 131 and 133, they are down converted to a second IF at 100 KHz by mixers 138 and go through a pair of multiplexers 136 and variable gain amplifiers 134 in the second IF section 135. Amplifier gain is controlled and calibrated digitally and is varied by autoranging to optimize the second IF signal levels 130 and 132 available to the synchronous detectors 131 and 133 resulting in an order of magnitude improvement in signal to noise performance and dynamic accuracy for the detector output signals x1, y1, x2, and y2. Likewise, the synchronous detectors 131 and 133 employ a digital architecture that allows for precise control of their 90 degree phase shift function which results in improved accuracy as well as common mode rejection of local oscillator phase noise effects. Finally, the detected signals x1, y1, x2, and y2 are multiplexed with a sample-and-hold/multiplexer (MUX) 137 and then digitized by an analog-to-digital converter (ADC) 139 with 19 bits of resolution. Each ADC conversion takes approximately 40 microseconds and four readings are made for each RF frequency data point to provide the real and imaginary data for both the reference signal 130 and test signal 132.

The output of the ADC 139 is then passed on a 16 bit bus 141 to a high speed central processor (CPU) 143 which includes a microprocessor such as a Motorola 68000 as well as the associated microprocessor system interrupt and I/O control circuitry. Because the CPU 143 is integrated into the main network analyzer 101 it is possible to utilize a multi-tasking architecture to make more efficient use of time than has previously been possible. This architectural integration also permits substantial increases in data processing flexibility and system control performance. Via a dedicated system interface and bus 145, the CPU 143 controls the RF source 109, the test set 107, and, along with the sample selection and timing circuitry 146, all of the IF processing functions including the phase lock hardware 125, autoranging in the IF amplifiers 134, detection by the synchronous detectors 131 and 133, and digitization by the ADC 139. The CPU 143 periodically initiates a self calibration sequence for the IF amplifiers 134, synchronous detectors 131 and 133, and the ADC 139 and the resulting gain, offset, and circularity changes are stored in memory 147, so that the changes in the IF amplifiers 134 can be subtracted from measured results. The CPU 143 also performs all data processing functions for the system. The signals in the IF section 103 are detected as linear real and imaginary components of a vector quantity and the CPU 143 processes the detected data into a variety of formats for presentation on the CRT display 149. By digitally computing the various measurement formats, improvements in dynamic range and meaningful resolution are gained over traditional analog circuit processing techniques.

With past network analyzer systems, an external computer was required in order to characterize and remove systematic errors. With the present invention, this capability exists internally with enough storage capacity (i.e., 256K bytes of random access memory (RAM) and 256K bytes of bubble memory) in the memory 147 to retain up to two 401 point 12-term error corrected traces of data. (Note: each byte of memory consists of eight bits of data storage.) In addition, the measured data can be converted to show the response of the DUT 111 as a function of time (time domain) using an internal Fourier transform process. All data processing takes place virtually in real time by means of parallel data processing in the CPU 143 aided by the incorporation of a dedicated, floating point, complex number, vector math processor 151 designed specifically for fast vector computations. The multiplication of two complex numbers by the vector math processor 151 requires only one operation with the product available within 20 microseconds, so that error corrected measurement results are available 1000 times faster than in the prior art. By means of an internal vector graphics generator 153, the real time processed data is then immediately presented on the CRT 149, on a digital printer/plotter 155, or via an IEEE-488 (HP-IB) interface and bus 157 to external devices. Present as well as past states of front panel controls 159, past and present traces of data, and entire system calibrations can also be stored in and recalled from the memory 147 or loaded and read from a built-in tape drive 161 by means of the system interface and bus 157 under control of the CPU 143.

Integrated Processor

As explained previously and shown in more detail in figure 2, the built-in CPU 143 with its 16-bit multi-tasking microprocessor 201, I/O interface circuitry 203, and interrupt system and I/O control circuitry 205, and the vector math processor 151 with its math processor circuitry 207 and math controller 209 are key to the high speed performance of the present invention. The variable precision and variable function architecture of the vector math processor 151 make it adaptable to perform both floating point and complex number math operations. The vector math processor 151 operates on a 16 MHz clock 208 generated within microprocessor 201 and is controlled by a state machine 210 with 1K byte of read only memory (ROM) for storage of microcode as shown in Appendix C of U.S. Pat. No. 4,636,717, which has been incorporated herein by reference.

To insure maximum processing speed, processing power is distributed among several internal controllers in addition to the microprocessor 201 and the math processor 207. An additional state machine with 1K byte of microcode is used by the display generator 153 to create the display of both data and display formats from a list in the display RAM 217 which drives the CRT 149 in the display section 218 from a line generator 219 which positions a new X-Y point pair approximately every four microseconds. Likewise both the system bus 145 and the external HP-IB bus 157 have their own internal processors 221 and 223. Finally, controllers 225, 227, and 229 are dedicated to the tape drive 161, the bubble memory 231 within memory 147, and the front panel 159 respectively.

Memory is also distributed accordingly to functional need. 16K bytes of ROM 233 within memory 147 are used for internal test software and boot-up of the system. The main system software is taken from a first 128K bytes of non-volatile bubble memory 235 within memory 147 and placed into 128K bytes of main RAM 237 also within memory 147. 8K bytes of ROM 239 are dedicated to the bubble memory 231 for use in test and boot-up. 60K bytes from the second 128K bytes of bubble memory 235 are used to store equation coefficients used in vector error correction. The remaining 68K bytes to bubble memory 235 contain recallable instrument states, measurement memory data and additional system software. The contents of the CRT display are stored in 32K bytes of display RAM 217. The remaining 96K bytes of display RAM 217 are used for data, coefficients, and control tables. Personal back-up storage, test software, additional system software, and data can be stored and accessed as desired on cartridges in the tape drive 241.

Figure 2:
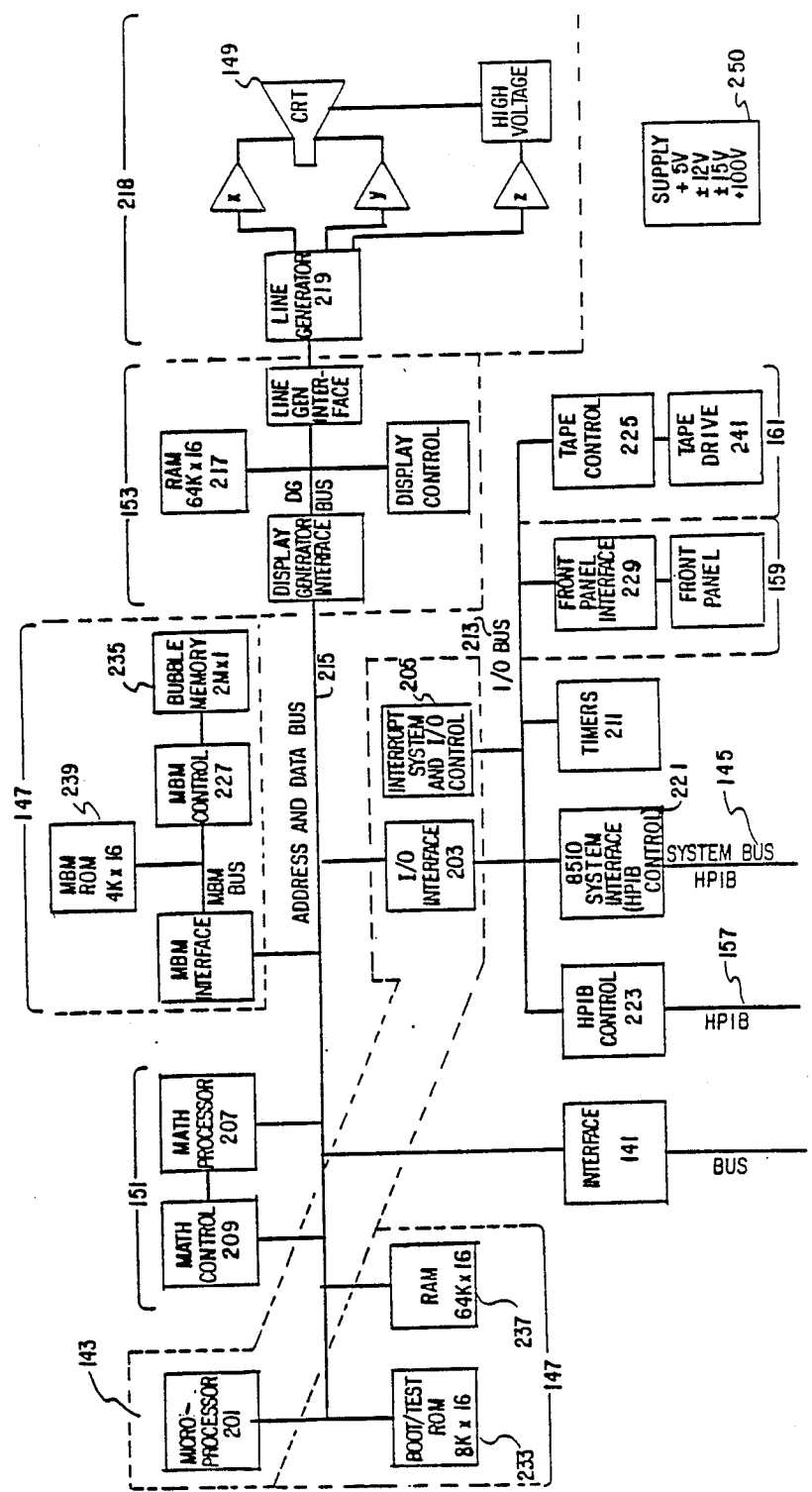
FIG. 2 shows a detailed block diagram of a portion of the preferred embodiment shown in FIGS. 1A and 1B.

FIGS. 3.1 through 3.102 show the detailed schematics of the block diagram shown in FIG. 2 and can be found along with a description in U.S. Pat. No. 4,636,717, which has been incorporated by reference.

Description of the Front Panel, Menus, and Displays

Figure 3A:
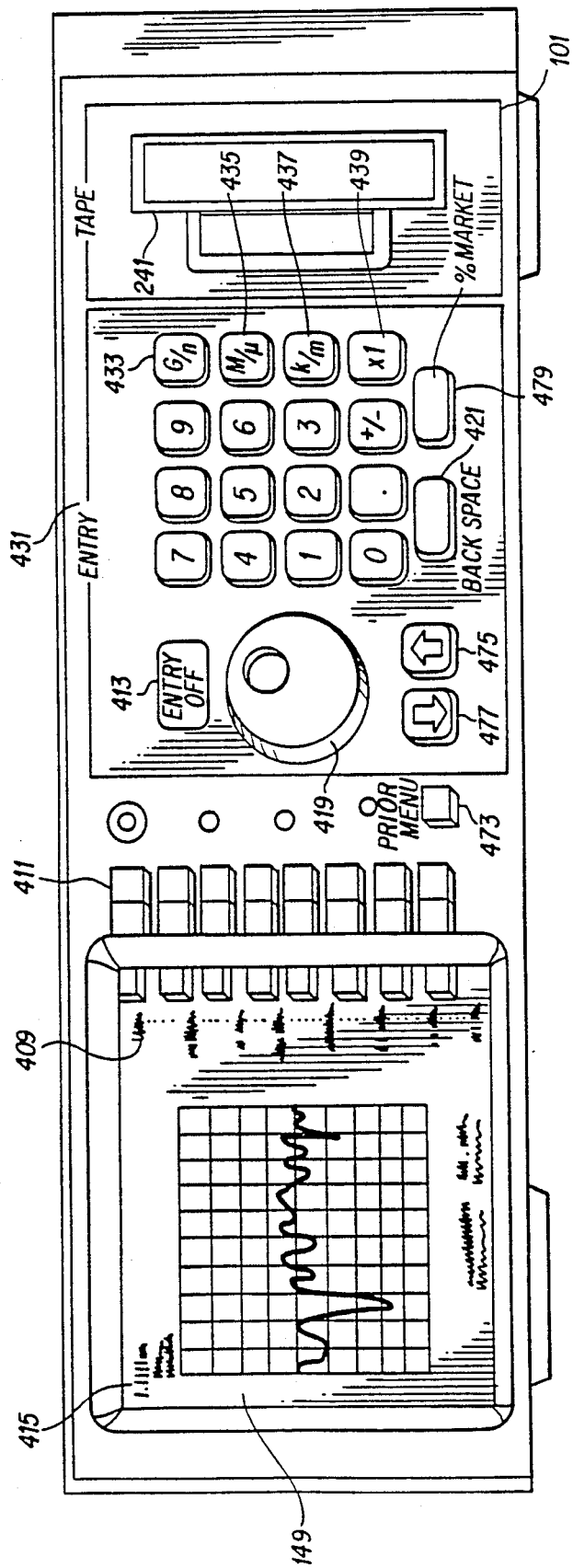
FIGS. 3A through 3C shows the front panel controls of the preferred embodiment of the present invention.
Figure 3B:
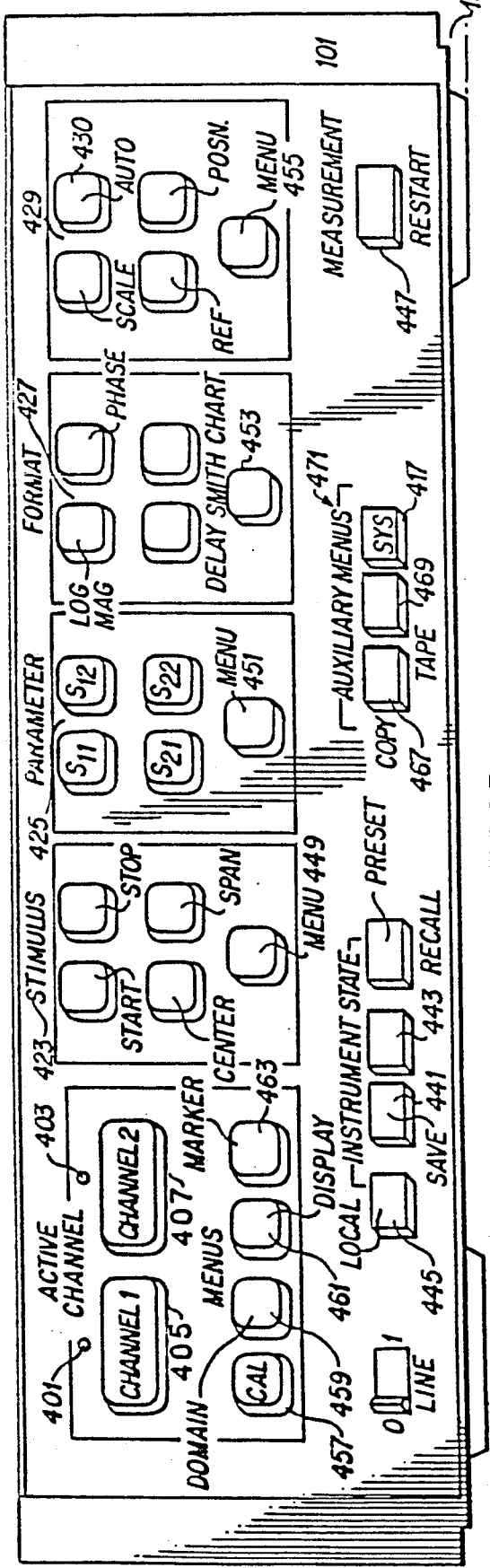
Figure 3C:
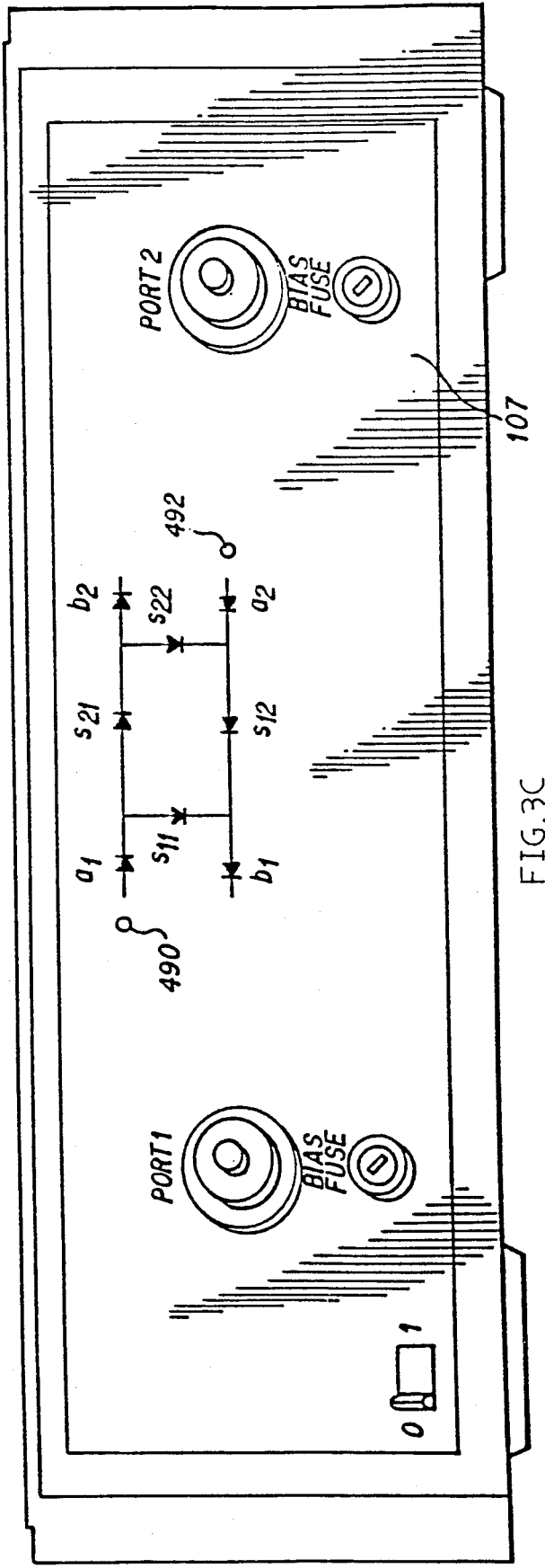

FIGS. 3A–3C show the front panel 159 of the present invention with capability to set up and control two independent measurements with two measurement channels selected by channel buttons 405 and 407. When the indicator 401 or 403 above the channel buttons 405 and 407 is lit, the respective channel is selected as the channel controlled by the front panel 159. The CRT 149 is also available for viewing on the front panel 159. Annotation on the CRT 149 includes graticules if desired, labels for one or two data side by side or overlaid data traces, reference line position symbols, and channel labels for the parameter being shown, the format of the display, reference line value, horizontal and vertical scales, and the value of any markers being used. Source frequency or other stimulus information is shown on the CRT 149. An active entry menu area 409 in which no data traces are displayed is also provided on the CRT 149 for identification of the current active functions which may be selected via the CRT softkeys 411. The softkeys 411 therefore extend the accessible instrument capabilities by adding selectable functions without adding to front panel complexity. An Entry Off key 413 clears the active entry state. Prompts, indications of instrument functions, procedural instructions, error messages, and procedural advisories also appear on the CRT 149. If a message is important to the measurement, a beep sound signals the operator to look at the message. A title area 415 is also provided for up to 50 characters of information about the measurement being viewed. To use the title function, the Auxiliary Menus System button 417 is pressed, followed by one of the softkeys 411 which will be labeled Title. The RPG knob 419 is then rotated to position an arrow symbol below the first letter desired and displayed on the CRT 149. The user then presses a Select Letter softkey 411 and the selected letter will appear in the title area 415. This process is repeated as desired along with desired Space softkeys 411 and Backspace keys 411, terminated with the Done softkey 411 and cleared with the Clear Softkey 411.

All basic measurement functions are controlled by the four groups of keys (SPFR) labeled Stimulus 423, Parameter 425, Format 427, and Response 429 which respectively are used to set the stimulus, select the parameter, select the format, and adjust the response for the desired measurement. The Stimulus keys 423 provide direct control of the source 109 to set the frequencies, source power, sweep time, and other related functions. The Parameter keys 425 select the parameter to be measured. With the source 109 applied to port 1, $S_{11}$ is selected for reflection return loss) and $S_{21}$ is selected for transmission (insertion loss or gain). Likewise, with the source 109 applied to port 2, $S_{22}$ is selected for reflection and $S_{12}$ is selected for transmission. Appropriate control of the test set 107 is enabled automatically depending on the parameter selected. The Format keys 427 place measured parameter data in the desired format: logarithmic (dB), phase, group delay, and Smith Chart, or, alternatively, SWR, linear magnitude, R +jx impedance, and others. The Response keys 429 set the scale per division, reference value, or reference position, or let the AUTO function via the Auto Key 430 automatically place all the measured data on the entire display 149 with pleasing values for a reference value and scale. Additional Response functions include averaging, smoothing, and an electronic line stretcher.

Figure 4:
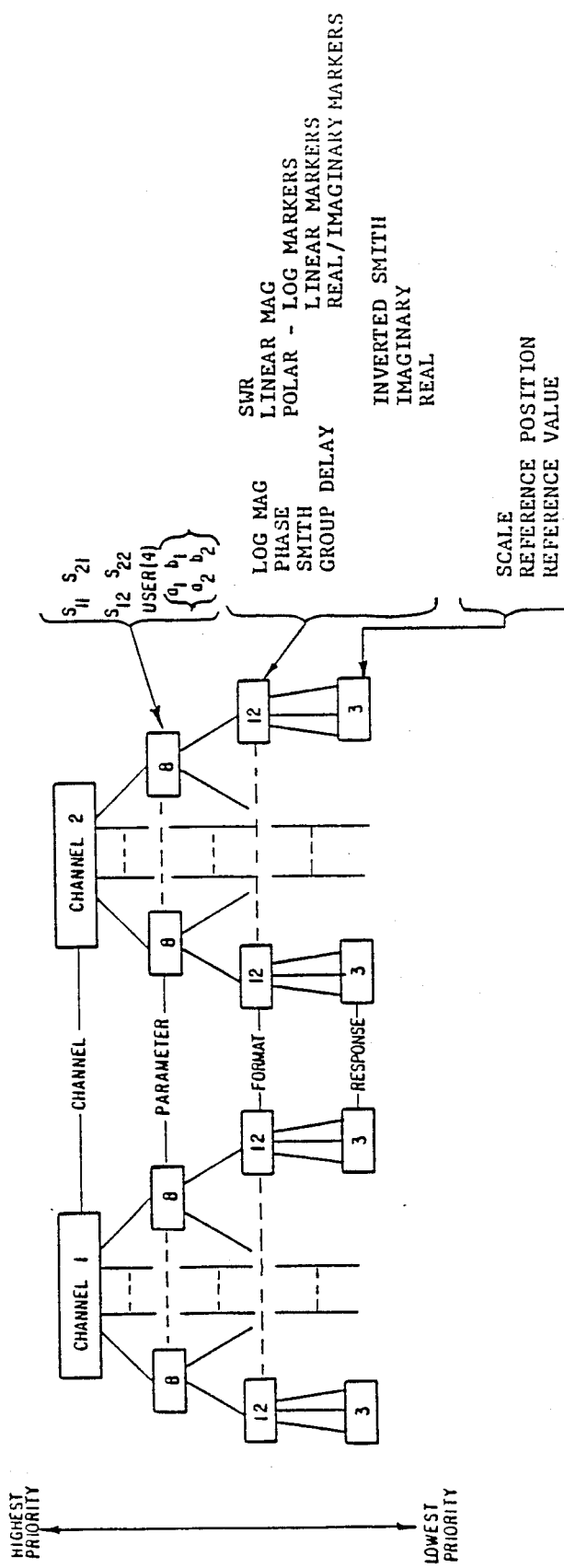
FIG. 4 shows a hierarchal SPFR structure used in the preferred embodiment of the present invention.
Figure 5:
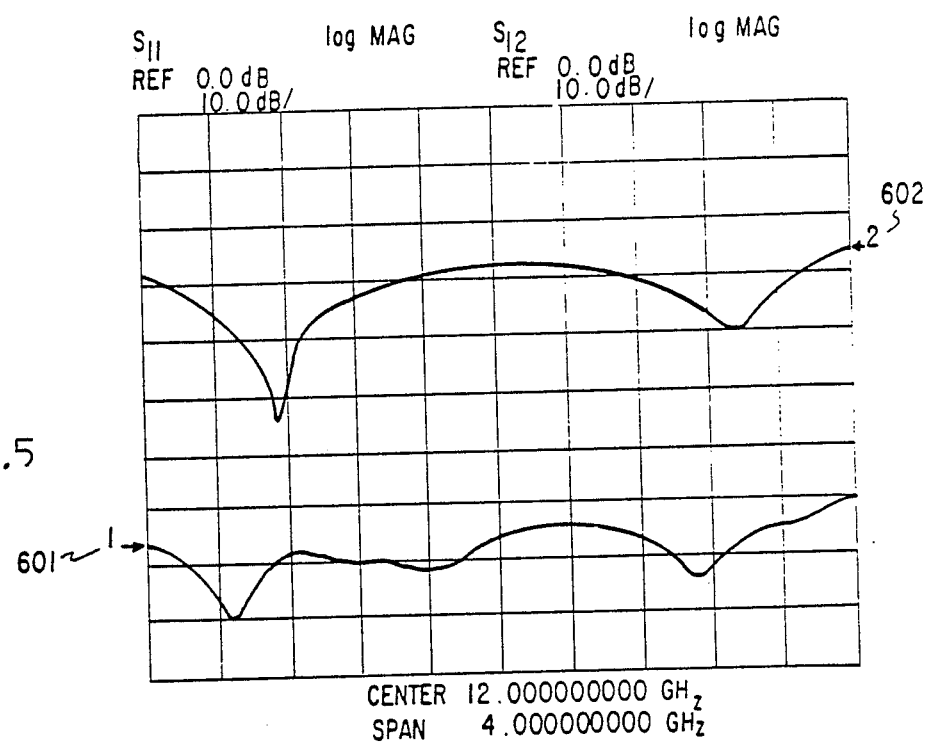

The hierarchal Channel-Parameter-Format-Response (CPFR) structure used in the present invention is shown in FIG. 4. Once a particular path through the CPFR structure has been chosen, this path is stored in the memory 147 for latter reference. Then, when one of the CPFR structure items is changed, such as changing the Parameter from $S_{11}$ to $S_{22}$, the entire path previously associated with the new item is automatically reestablished for use by the entire system. Thus, for example, if Channel 1 is presently being used to measure the Parameter $S_{11}$ with the display in log magnitude Format and a 0.2 dB/division vertical Scale, and if Channel 1 was previously used to measure the Parameter $S_{22}$ with the display in linear magnitude Format and a 5 milliunits/division vertical Scale, then when the Parameter is changed from $S_{11}$ to $S_{22}$ the Format automatically changes from log magnitude to linear magnitude and the Scale automatically changes from 0.2 dB/division to 5 milliunits/division. In addition, since the CPFR structure is an hierarchal tree and since Parameters are lower in the hierarchy than Channels, the Channel number will not be changed when the Parameter is changed as in the present example. Similarly, if the Channel is changed, the Parameter, Format, and Response are all subject to automatic reestablishment, and if only the Format is changed, only the Response is subject to automatic reestablishment. Naturally, any of the SPFR values may be altered from the front panel 159 as desired by the user. The result of this hierarchal SPFR structure is a substantial added degree of speed and convenience for the user.

The numeric Entry keys 431 are used when a numeric value is to be entered, which entered value is terminated by one of the four terminator keys G/n 433, M/u 435, k/m 437, and x1 439. The four terminator keys 433-439 are uesd when the entered value being terminated has the order of magnitude respectively of either Giga ($10^{+9}$) or nano ($10^{-9}$), Mega ($10^{+6}$) or micro ($10^{-6}$), kilo ($10^{+3}$) or milli ($10^{-3}$), or a basic unit ($10^{\circ}$) such as dB, degree, second or hertz. The four terminator keys 433-439 are therefore unique in that no particular set of measurement units is permanently assigned to any of the keys, so that substantially fewer terminator keys are required than in the prior art.

Pressing the Save key 411 followed by one of the CRT softkeys 411 saves the current complete state of the network analyzer 101, and the controlled functions of the source 109 and the test set 107. The Recall key 443 followed by a CRT softkey 411 is used to recall the previously stored instrument state. The hierarchal SPFR structure is an integral part of the instrument state.

The Tape key 469 in the Auxiliary Menu Block 471 displays soft keys 409 for controlling the internal tape drive 241. The tape functions allow initialization of cassette tapes, storing data to tape, loading data from tape, deleting data on tape, erasing the last deletion of data, and display of a directory of tape contents on the CRT 149. Tape data can be a combination of any of the following:

1. Measurement data after second IF and detector correction (raw data), after error correction and/or time domain coversion (data), or after formatting (formatted data) for either or both measurement channel.

2. Memory data stored after the time domain coversion and before formatting from an earlier measurement, individually or all at once.

3. Graphics that the user has created on the CRT 149 FIG. 3A.

4. One or all sets of machine states stored by pressing the Save key 441 FIG. 3B.

5. One or all sets of error coefficients measured and stored by pressing the CAL key 457 (FIG. 3B), and the subsequent Calibrate soft keys 411 labeled in the area 409 of FIG. 3A.

6. One or all sets of calibration standard descriptions Cal Kits).

7. A complete machine dump consisting of all sets of all data described in 1 through 6.

8. System, service, or demo software, including options, revised versions, and new software.

When measurement data is loaded from tape to any point in the Data Processing path, the display on the CRT 149 is updated to show the loaded data with subsequent data processing.

If an external device has control of the system using the HP-IB interface 157, pressing the Local key 445 returns control of the system to the front panel 159.

The Restart key 447 is used to restart any previously started measurement or data handling operation such as sweeping or averaging.

Three blocks of the front panel keys along with the softkeys 411 provide an additional feature called MENUS for functions which are used less frequently than the functions to which dedicated keys are assigned. The four Menu keys 449, 451, 453, and 455 provide extensions of the SPFR keys 423, 425, 247 and 429; the keys labeled CAL 457, Domain 459, Display 461, and Marker 463 in the Menus block 465 allow selection of various measurement and display modes; and the keys labeled Copy 467, Tape 469, and System 417 under the Auxiliary Menus block 471 provide measurement related input and output operations. Shown in Appendix A is a list of the various MENUS along with the softkey labels, shown in quotation marks, as displayed in the menu area 409 of the CRT 149 opposite the related softkeys 411. Also shown for the softkey labels in Appendix A are the names of the constants assigned to the softkey labels as found in the system source code in Appendix B. Appendix A and Appendix B can be found in U.S. Pat. No. 4,636,717, which has been incorporated herein by reference.

When a MENU is displayed on the CRT 149 any current choices are indicated by a line under the labels and mutually exclusive and/or closely related choices are connected by dots. Pressing the softkey 411 beside any label in area 409 either executes the function or presents another set of MENU labels. If the selected function requests an input, the RPG knob 419 and Entry keys 431 are used to respond. Additional functions are selected by pressing another key. A Prior Menu key 473 is used to return to the previously displayed MENU in a series of menus. If the previously displayed MENU was the first in a series of MENUS, the MENU is cleared from the CRT 149.

Figure 6:
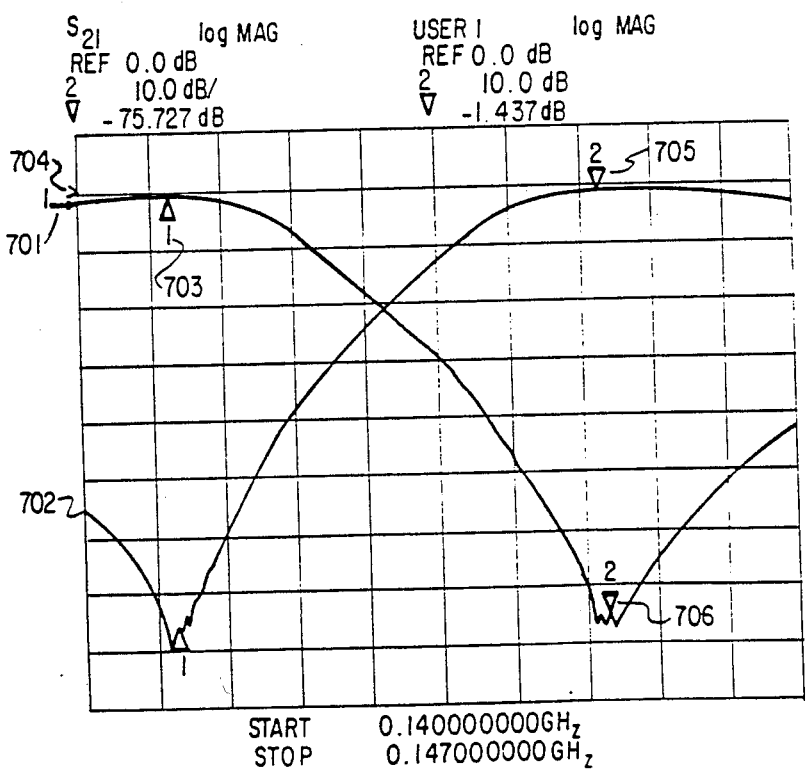
Figure 7:
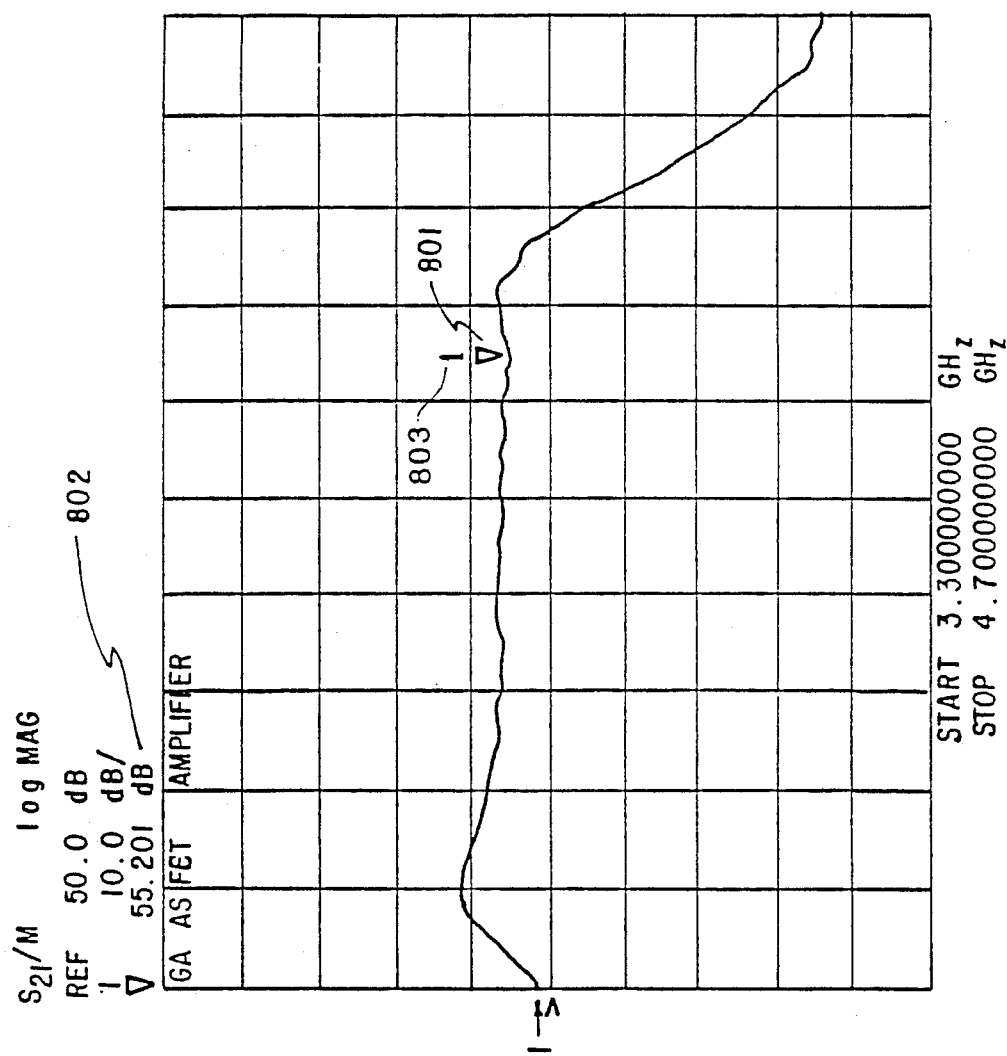
Figure 8:
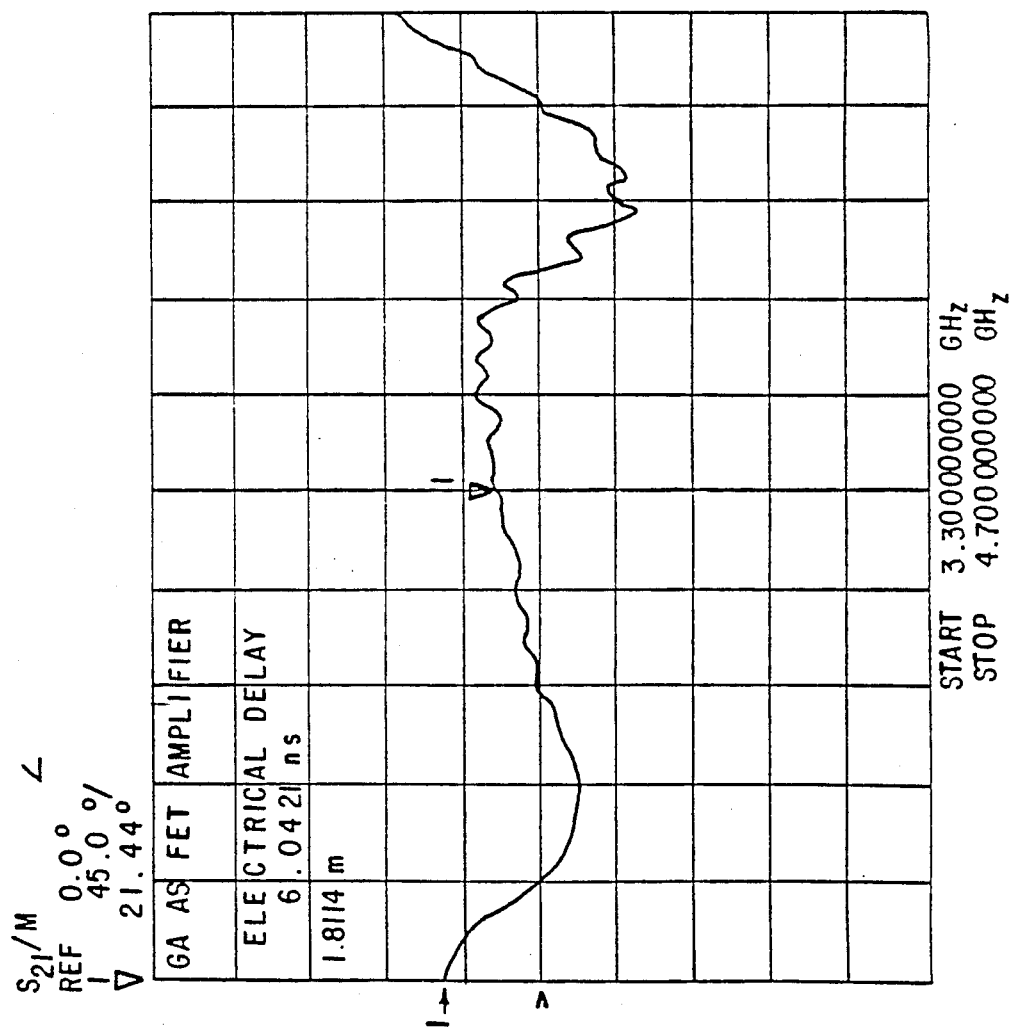
Figure 9:
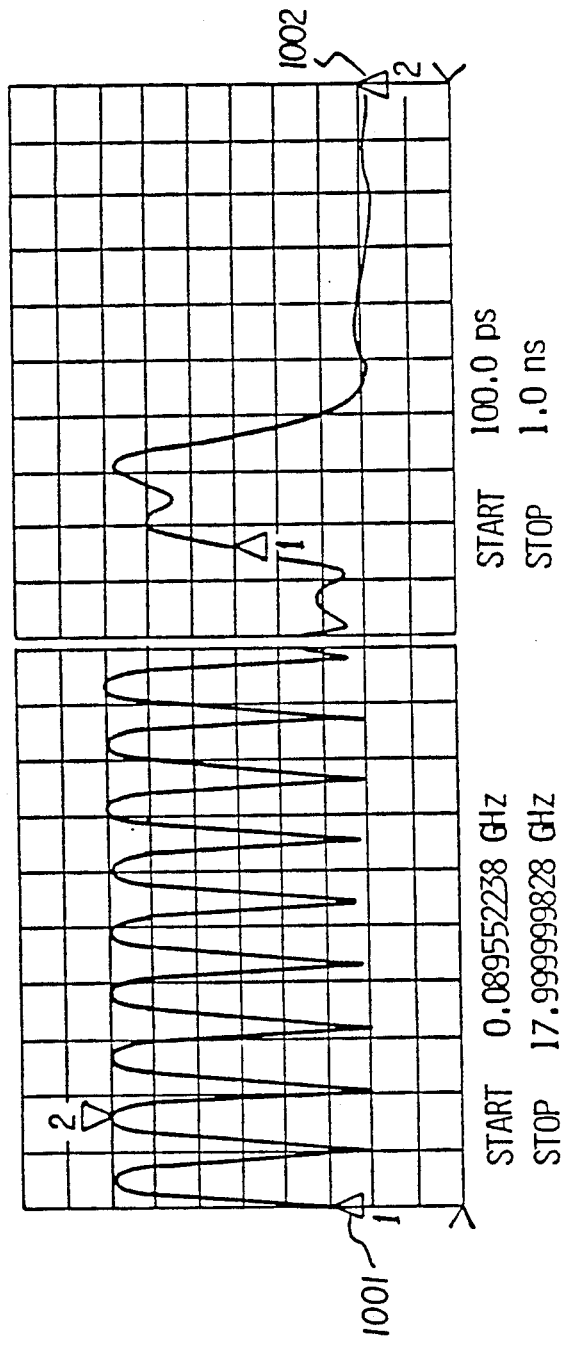
Figure 10:
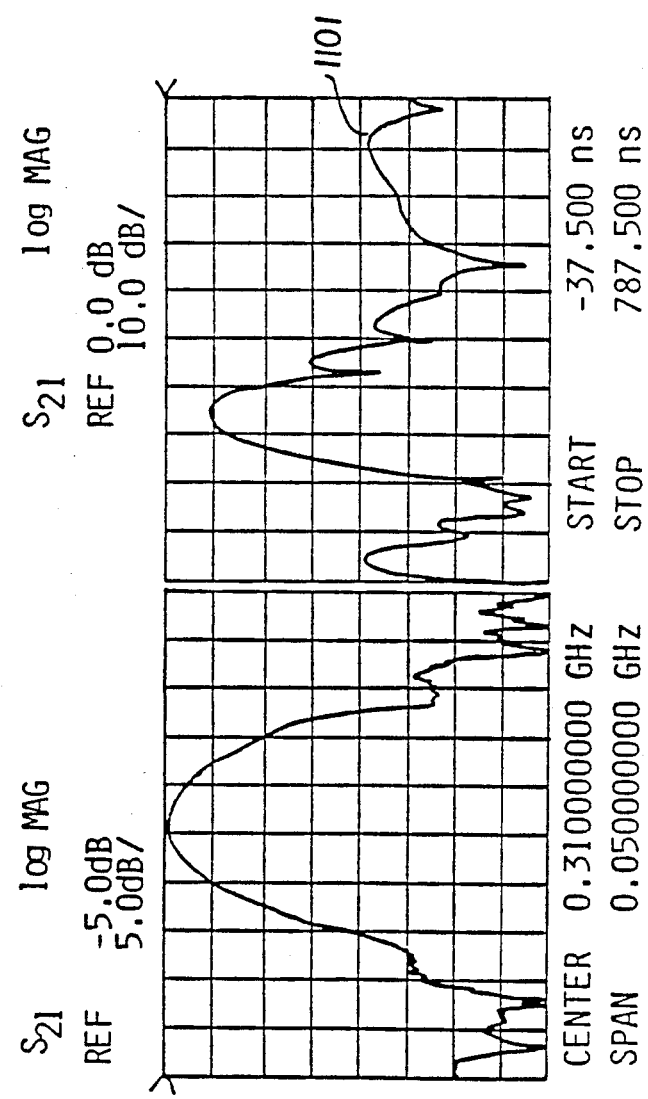
Figure 11:
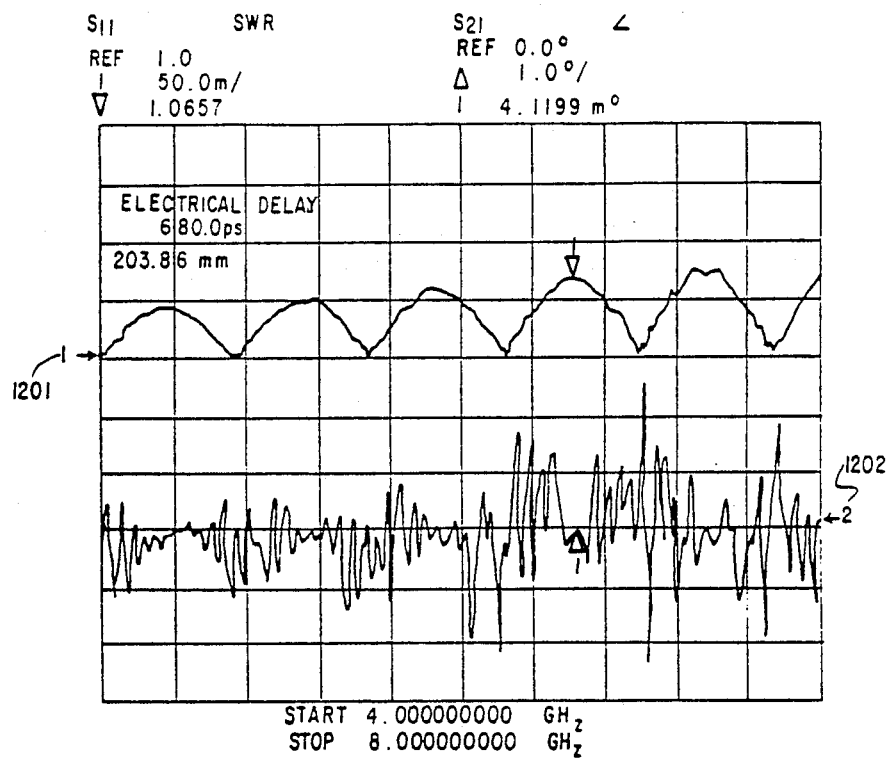
Figure 12:
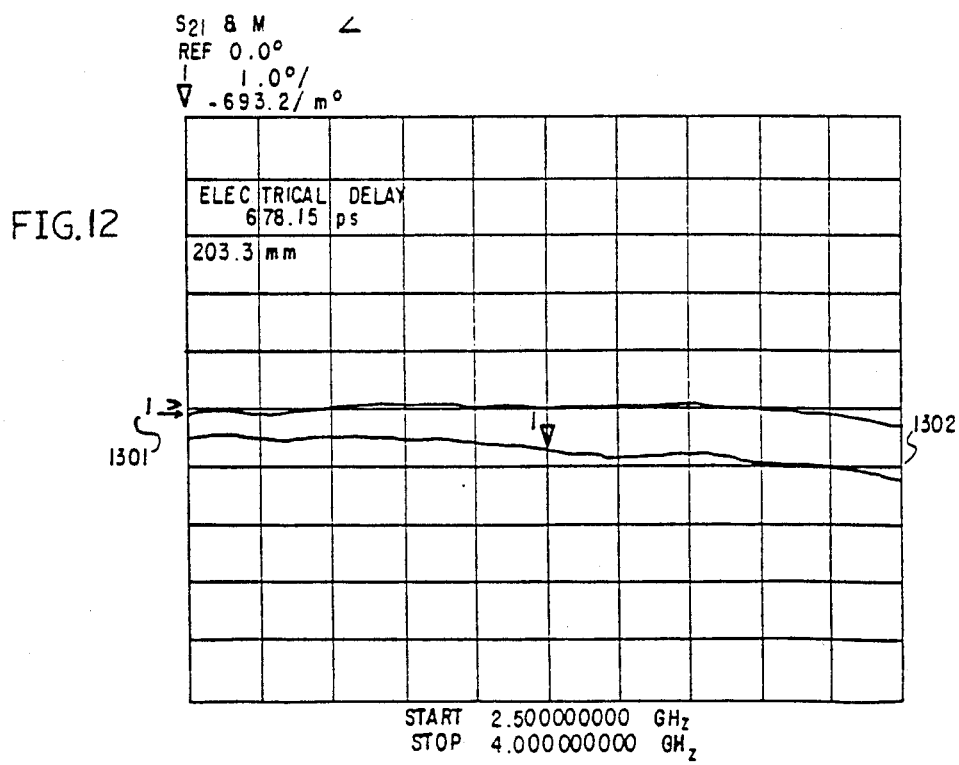
Figure 13:
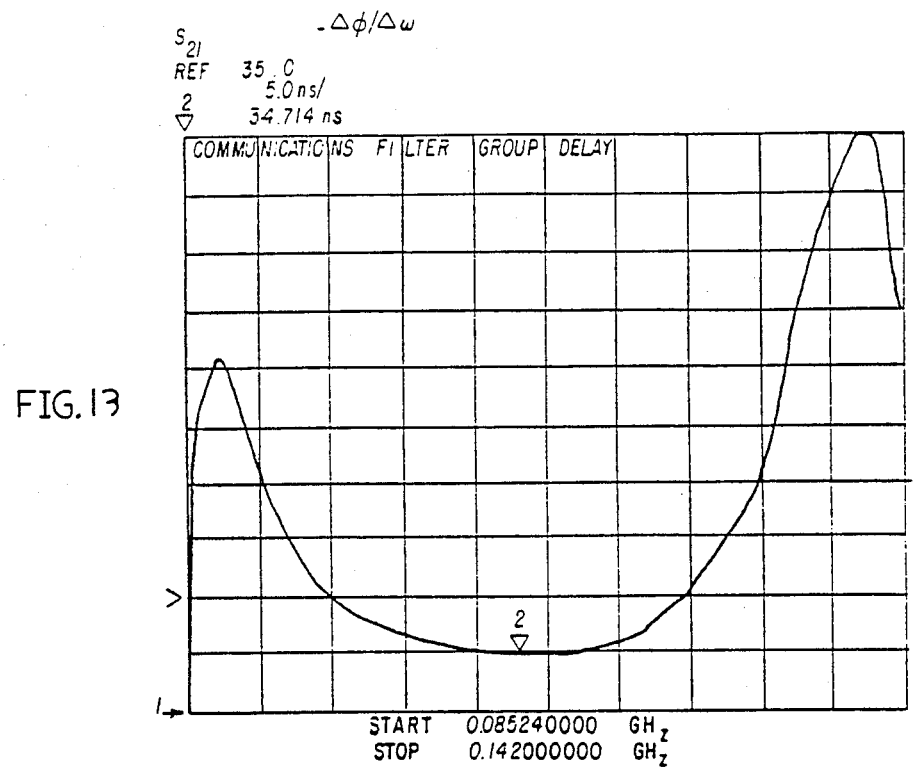
Figure 15:
FIG. 15 shows a coaxial line as measured and displayed in FIG. 14.
Figure 14:
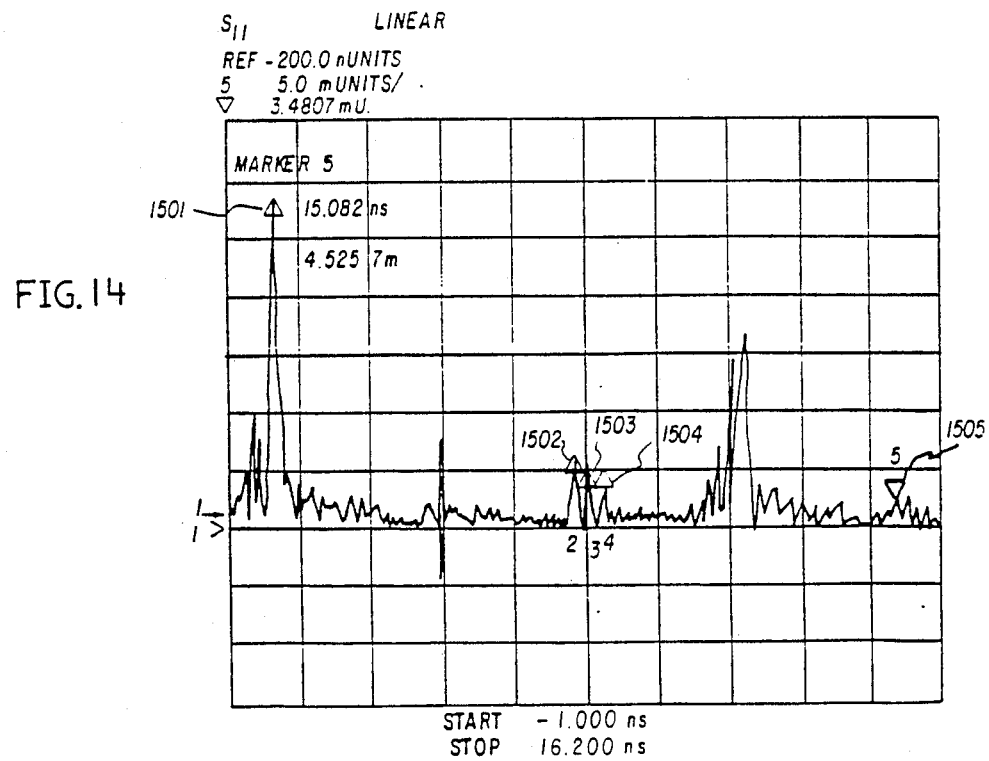

Several of the wide variety of displays available either on the CRT 149 or on the printer/plotter 155 are shown in FIGS. 5 through 14, 15 and 17. FIG. 6 shows a typical dual trace measurement of two different parameter $S_{11}$ and $S_{12}$ signified by trace number 601 and 602 respectively with the same log magnitude format used for example to adjust a circulator's impedance and isolation simultaneously in real time. FIG. 6 shows two overlaid traces 701 and 702 for ports 2 and 3 respectively of a three port multiphase filter. FIG. 8 shows a single trace of an amplifier and an attenuator combined to show the total closed loop response of the active circuit. FIG. 8 shows a measurement trace of the same active amplifier as in FIG. 7 calibrated in a user defined reference plane with an electrical delay of 6.0421 nanoseconds making use of the electronic line stretcher. FIGS. 9 shows a unique split screen of two simultaneous measurements of two different parameters $S_{11}$ and $S_{21}$ as displayed on the CRT 149. FIG. 10 shows another version of the split screen display, split to simultaneously show the response of a surface acoustical wave filter (SAW device) in both the frequency and time domains. Note the appearance of the triple travel peak 1101 on the time domain response. FIG. 11 shows two different parameters displayed with two different formats (i.e., SWR and deviation from linear phase) for traces 1201 and 1202. FIG. 12 shows a previous measured trace 1301 from "memory" and the current measurement trace 1302 of the same parameter $S_{21}$ which can be used for matching transmission lines to within 0.01 degrees. FIG. 13 shows the display of group delay for a typical RF communications filter which with the present invention can be viewed and adjusted for optimum group delay flatness in real time. FIG. 14 shows a linear display of an RF circuit in the transformed time domain along with a series of five markers 1501–1505 to mark the five different corresponding discontinuities respectively (i.e., connector 1601, connector 1602, adapter 1603, connector 1604, and termination 1606) of a coaxial line 1610 as shown in FIG. 15. FIG. 16 shows a split screen of two polar plots as displayed simultaneously on the CRT 149. Each of the FIGS. 5 through 14 and 16 are displays of actual RF devices as shown in real time on the CRT 149. These same displays can also be printed on the printer/plotter 155 as they are shown on the CRT 149 with whatever size change is desired and in a variety of colors. If desired, various of the CRT displays can also be combined on the printer/plotter 155 as a four quadrant plot as shown in FIG. 17.

Up to five different markers for the traces on the CRT 149 are accessed via the Marker key 463 along with the softkeys 411 as shown in FIG. 14 by markers 1501–1505. The markers are controlled in a number of different ways as explained in U.S. Pat. No. 4,636,717.

Description of the Test Sets

Figure 18:
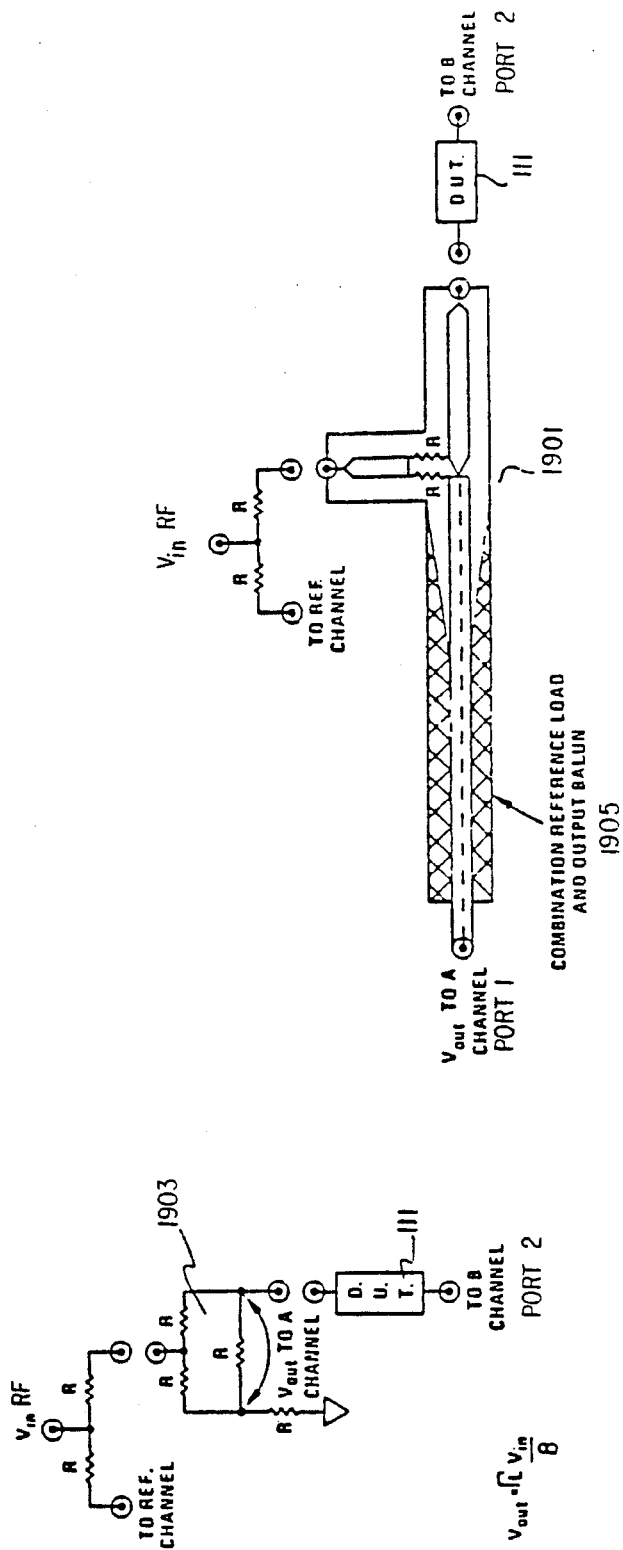
FIGS. 18a and 18b show a schematic and a cross sectional view respectively of a wideband RF directional bridge for use in a preferred embodiment of the present invention.
Figure 19:
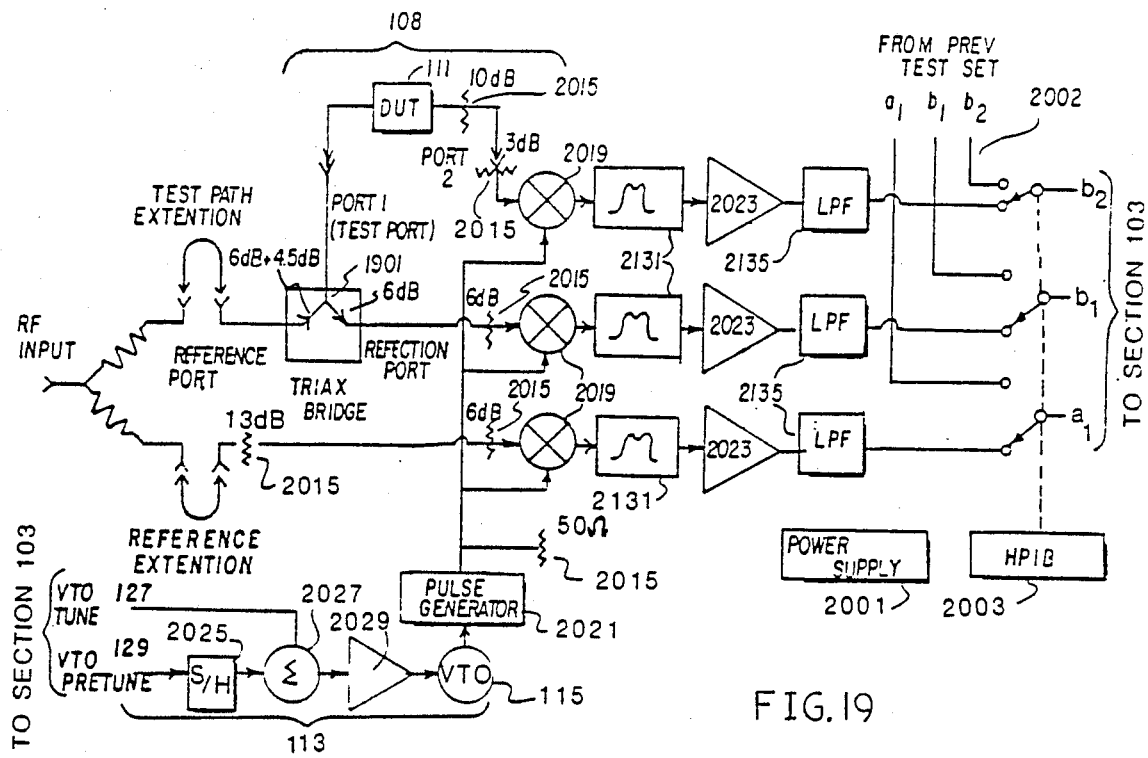
FIGS. 19 through 22 show detailed block diagrams of four test sets as shown in FIGS. 1A and 1B.
Figure 20:
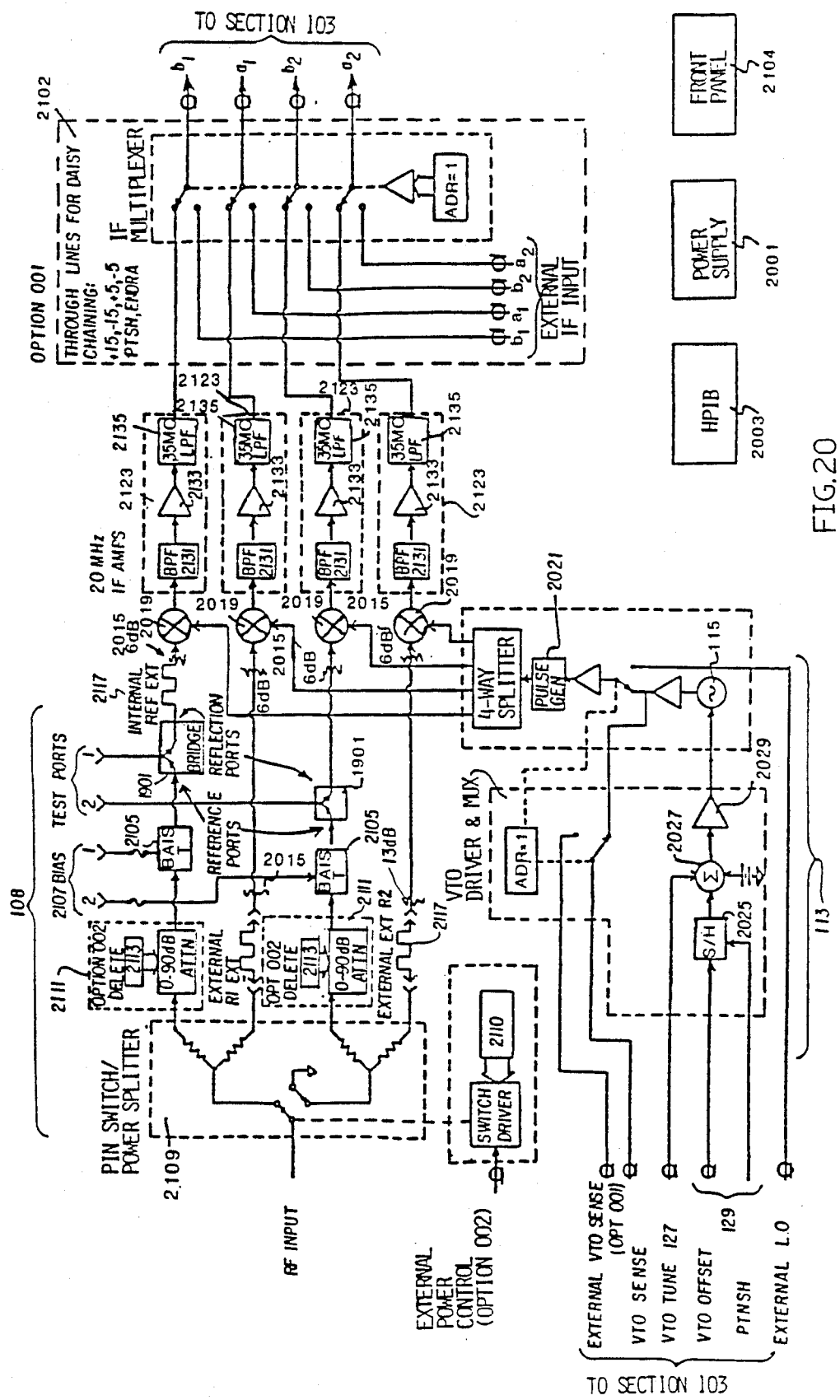
Figure 22:
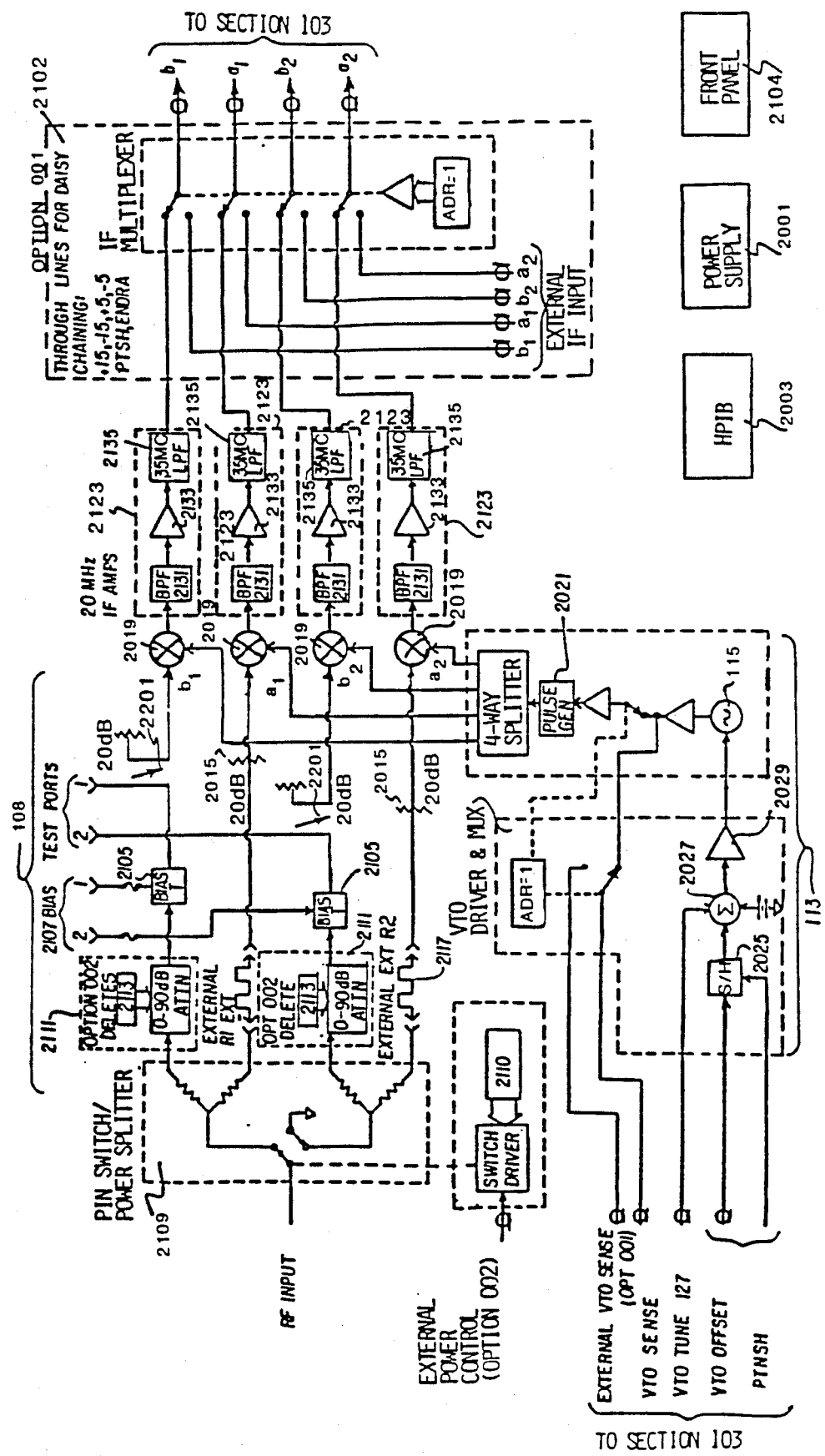
Figure 23:
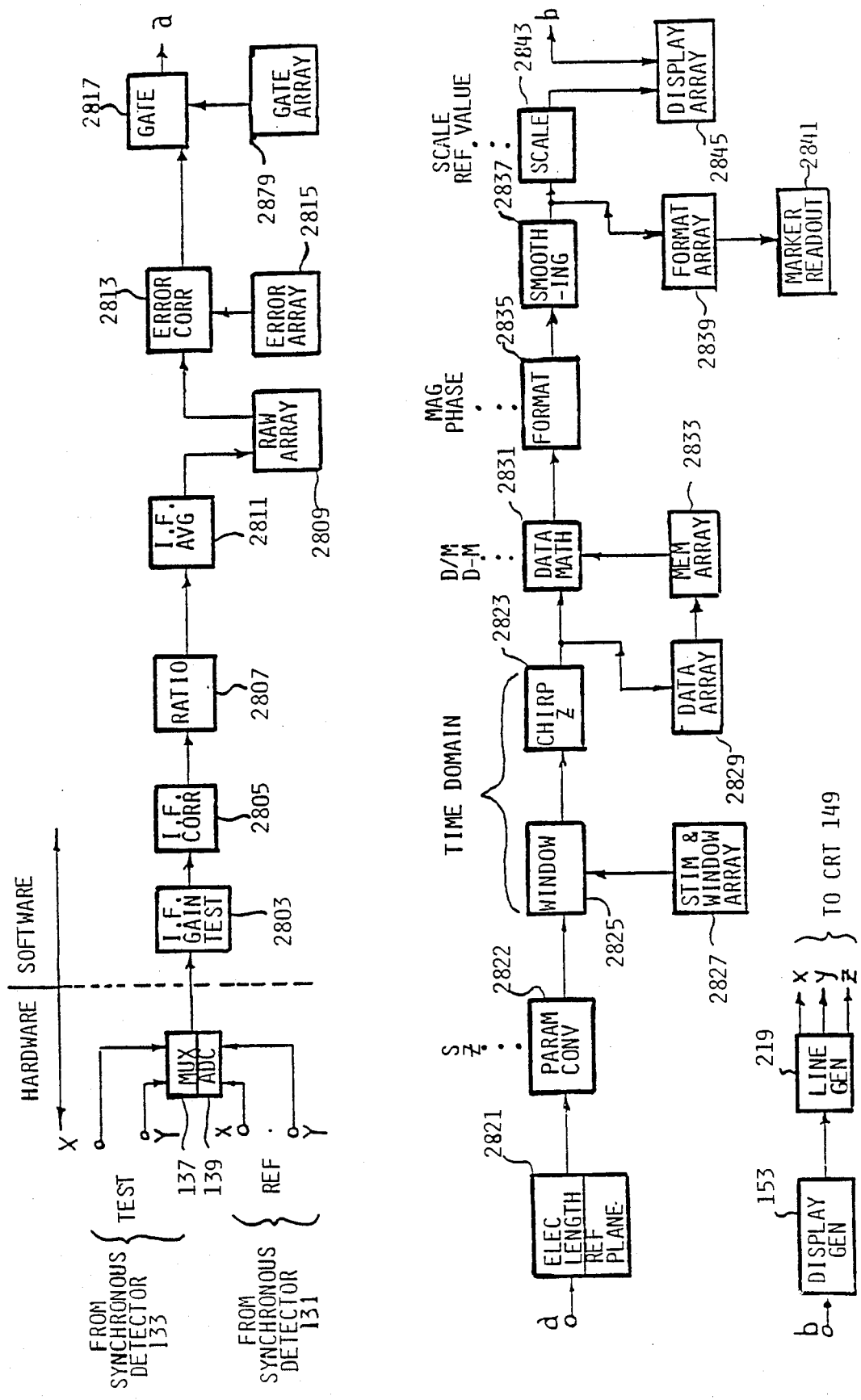
FIG. 23 shows the software signal processing flow used in the present invention.

The wideband test sets 107 to 26.5 GHz include a high performance RF triaxial directional bridge 1901 as described in U.S. Patent Application Ser. No. 06/568,986 entitled "RF Triaxial Directional Bridge" filed Jan. 9, 1984 by Botka et al. issued May 13, 1986, as U.S. Pat. No. 4,588,970, assigned to Hewlett-Packard Co., entitled "Three Section Termination For an R.F. Triaxial Directional Bridge, and shown in FIGS. 18a and 18b coupled to each of the DUT ports 1 and 2 as shown in FIGS. 19 and 20. The directional bridge 1901 is a balanced Wheatstone bridge 1903 that extracts a floating vector signal for measurement in a single-ended detector system without disturbing the balanced configuration. Included in this high performance RF directional bridge 1901 is a combination reference load and balun 1905 which provides signal separation over the entire frequency range from 45 MHz to 26.5 GHz, and also permits the application of a DC bias as part the RF input $V_{in}$ to the DUT 111 via a conventional RF bias tee 2105. In contrast, the narrower band test sets 107 as shown in FIGS. 1 and 22 utilize a conventional directional coupler 2201 for each port to cover the frequency range of 0.5 to 18 GHz. By incorporating the signal separation devices 108 in the test sets 107, broadband vector measurements are made possible with just one connection of the DUT 111 between port 1 and port 2.

Figure 21:
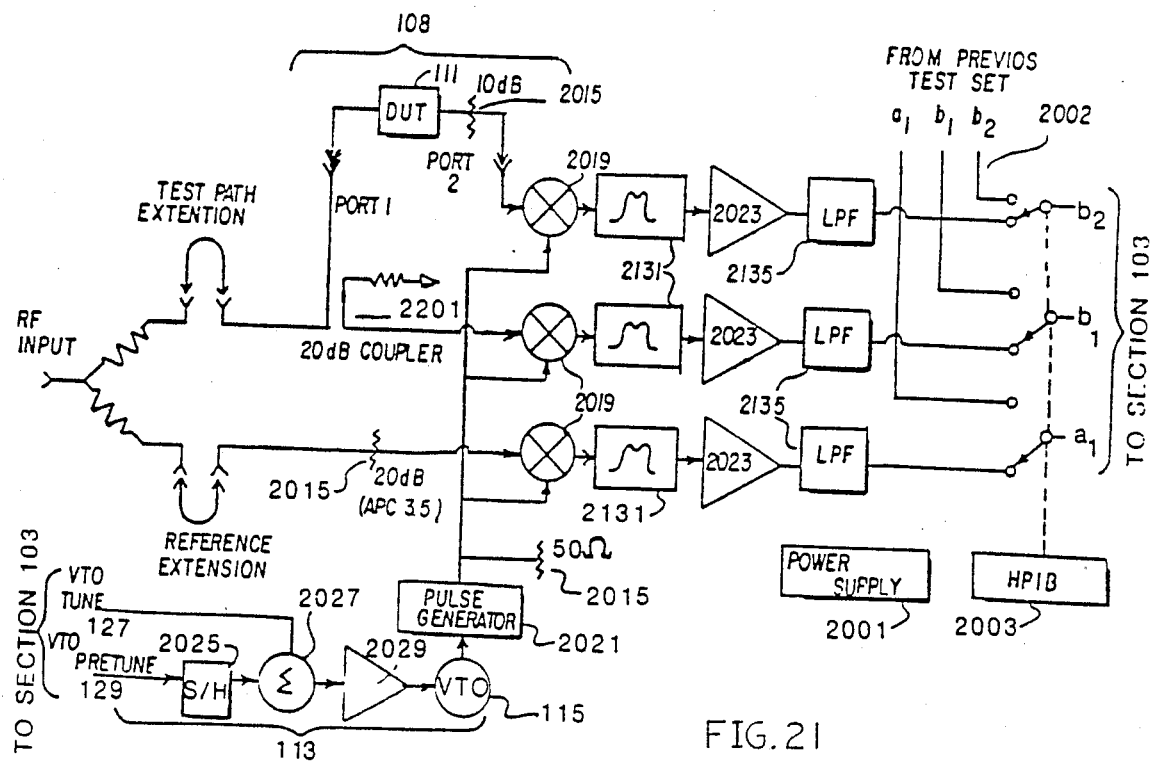

Each of the test sets 107 contains its own built in power supplies 2001, to simplify various system configurations and each of the test sets 107 has its own HP-IB interface 2003, coupled to the system bus 145 in order to provide control and identification to the main analyzer 101. Each of the test sets 107 is connected respectively to section 103 via a first IF multiplexer 2002 or 2102 to provide daisy chaining of several test sets. The first IF multiplexer 2002 and 2102 are in turn connected respectively to the a1, b1, and b2 connections for the reflection/transmission test sets in FIGS. 19 and 21 and the a1, a2, b1, and b2 connections for the S-parameter test sets in FIGS. 20 and 22. The S-parameter test sets also include: front panel indicators 2104 (i.e., lights 490 and 492 in FIG. 3C) to signal the active test port, a conventional bias tee 2105 on each of the test channels to provide voltage bias 2107 needed in the testing of active devices, PIN diode transfer switches 2109 under control of the main analyzer 101 via the system bus 145 and a switch interface 2110 for switching the RF input between the ports 1 and 2, and variable attenuators 2111 under control of the main analyzer 101 via the system bus 145 and an attenuator interface 2113. Various RF pads 2015 and test and reference extentions 2117 are provided to adjust and balance the RF power levels.

Each of the test sets has a frequency converter 113 to provide the first IF conversion of the RF signals in immediate proximity to the RF input and the test ports. Within the frequency converters 113 are the VTOs 115, the first IF samplers 2019, pulse generators 2021 to drive the first IF samplers 2019, and first IF amplifiers 2023 and 2123. The first IF amplifiers 2123 also include an input band pass filter 2131, a filter amplifier 2133, and an output low pass filter 2135 to provide additional signal shaping. Each of the VTOs 115 is driven by a sample/hold circuit 2025, a summing node 2027, and a buffer amplifier 2029 coupled to the phase lock circuitry 125 in section 103.

Figure 24:
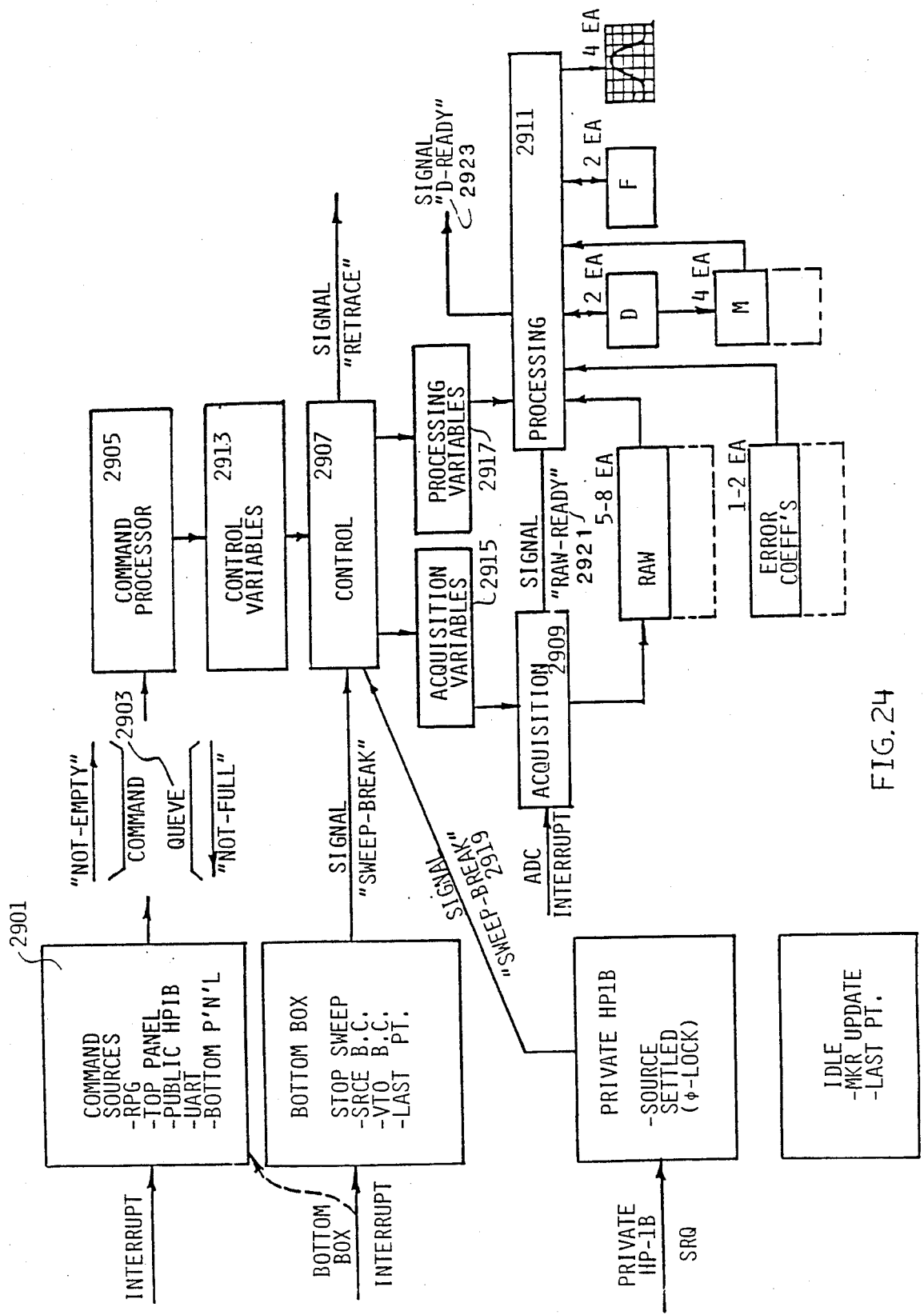
FIG. 24 shows the software process controller for use in the preferred embodiment of the present invention.

FIGS. 24.1A–24.33, which can be found in U.S. Pat. No. 4,661,767, show detailed schematics for the circuitry associated with the test sets 107 as shown in FIGS. 20 through 23. Second IF A detailed block diagram of the second IF/detector section 103 as shown in FIG. 1A and 1B is illustrated in FIGS. 25.1A through 25.6 of U.S. Pat. No. 4,661,767, which has been incorporated by reference. The second IF channels can be automatically calibrated for both gain and offset errors. This automatic calibration is described in detail in U.S. Pat. No. 4,636,717 with reference to FIGS. 26.1–26.6, which can be found in that same patent.

Software Signal Processing

As shown in the software listing in Appendix B, which can be found in U.S. Pat. No. 636,717 incorporated herein, and in figure 23, signal processing in the present invention begins at the output of the synchronous detector pair 131 and 133 which provide the real (X) and imaginary (Y) parts of the test and reference signals. Offset, gain, and quadrature errors are corrected for both of the IF/detector chains via software which is arranged as blocks IF gain test 2803 and IF Correction 2805. The resulting test and reference data is then ratioed in block 2807 to produce the appropriate S-parameters and stored in the Raw Array 2809. IF requested by the user, subsequent data taken at the same frequency are averaged together in the IF Averaging block 2811 to lower system noise and thus enhance dynamic range.

While the RAW Array 2809 is continually filled under control of the data acquisition software which will be discussed shortly, the data processing software concurrently removes data from the, Raw Array 2809 and performs additional signal processing. Using a one term model (vector frequency response normalization), a three term model (one port model), and up to a twelve term error correction model (comprehensive two port) of the microwave measurement hardware, the Vector Error Correction software 2813 in conjunction with the Vector Math Processor 151 provides corrected data through application of the Error Array 2815 to the Raw Array. Further data manipulation are provided as desired by the user through Gating 2817 along with the separate Gate Array 2819, Electrical Length/Reference Plane Extension 2821, and Parameter Conversion 2822. The corrected data may also be converted from the frequency domain to the time domain using Chirp Z transforms. Windows 2825 and Window 2827 are used to remove the ringing in time domain due to band limited frequency domain input signals and then using the Chirp Z transforms 2823 to transform into the time domain. The data in the Data Array 2829 may be stored into memory in the Memory Array 2833 and used in vector computations with data from a second device. Comparisons of present data (D) and memory data (M) is accomplished through vector computations to provide all four mathematical functions of D*M, D/M, D +M, and D−M. Storage of the corrected and processed data D in the Data Array 2829 and the trace math data M in the Memory Array 2833 allows rapid response to the user when marking format or trace math changes.

The vector data is then formatted in the Format block 2835 into magnitude, phase, group delay, or other formats as desired. Adjacent formatted points can then be combined if desired in the Smoothing block 2837. The resulting formatted data is stored into the Format Array 2839 which provides convenient access for scale and offset changes provided by the Scale block 2843. Markers are also applied as desired to the formatted data via the Marker Readout block 2841. Scaled data is stored in a Display Array 2845 in the Display Ram 217 from which the display generator 153 hardware repetitively creates a plot on the CRT 149 for a flicker-free display.

Input and output access is provided to and from all of the arrays via the HP-IB interface 157 and via tape 161 with S-parameters available from the Data Array 2829 in additional to other applicable arrays. Direct printer output for the printer 155 is made from the Format Array 2839. Direct plotter output for plotter 155 is made from the Display Array 2845. The user may also trade off the data update rate against the number of data points used by selecting resolutions from 51 to 401 points.

The software is structured as a multi-tasking system to provide a rapid data update rate by allowing data processing to take place when the data acquisition software is not busy. Overlying command and control tasks interleave data processing with data acquisition cycles to provide both two port error correction and dual channel display modes.

The software signal process discussed previously is controlled by a process structure as shown in FIG. 24. This process structure is one of the reasons the present invention can process RF data essentially in real time. For example, low priority processes such as controlling the source 109, controlling the test set 107, and formatting the display 149 are only performed when the data acquisition process is not busy. Previous systems would take data, process it completely through to the display and when the end of each sweep is reached, the processor had to wait for the hardware to reset. Instead, the present invention actually performs processing while the control functions such as resetting for a subsequent sweep or while switching S-parameter are proceeding. The Command Sources 2901 accept user command via the front panels 159 and the HP-IB interface 157, parses and converts the command to a common internal command taken regardless of source and puts the commands into a command queue 2903. The Command Processor 2905 takes the commands from the command queue 2903 and implements them. Any one time precomputation that will later improve run time efficiency is done at this time. The Command Processor 2905 modifies the instrument state and performs one time operations, such as updating a trace after scale change, outputting an array of data, and copying the Data Array into the Memory Array. Based on the instrument state, Control 2907 is responsible for insuring that the desired data is acquired in the specified manner and conditions. This includes control of source 109, test set 107, phase lock 125, IF multiplexers 136, ADC 139, and set up of the data acquisition and processing. Swept and stepped, alternate and chopped, single and continuous signal sweeps are implemented within Control 2907. Sweep maintenance is also managed in the Control 2907 to keep track of bandcrossings and frequency stepping. Acquisition 2909 services the ADC 139 interrupt, IF gain autoranging, ratioing, averaging and storing data into the RAW Array 2809. Processing 2911 processes data from the Raw Array 2809 until the data is displayed on the CRT 149 including vector error correction of external errors, parameter conversion, time domain processing (gating, windowing, and transformation), trace math (D*M, D/M, D +M, D−M), formatting (log, linear, and delay), and response (scale, reference value, and split screen).

The machine state variables that are used to derive control variables 2913 include: parameter descriptions such as test set set-up, receiver set-up, and ratio/non-ratio; user selections for frequency, power, sweep time, formats, scale per division, averaging information, number of points to be taken, error correction type, and time domain factors; and, internal housekeeping pointers to the data, raw, error coefficients, corrected data, formatted data, memory data, and display data arrays. Acquisition variables 2915 provide data reduced from the control variables 2913 for efficiency that are related to controlling the ADC 139 until the data is stored in the raw array. The Acquisition variables 2915 include: IF gain, receiver error, ratioing, averaging, and current pointer position in the raw array. The Processing variables 2917 provide data reduced from the group control variables for efficiency that are related to controlling the processing of data from the raw array through the display. The Processing variables 2917 include: current position pointers for the arrays, error correction type, time domain information, trace math, format, and response. The Signals 2919 provide synchronization between programs that otherwise function independently of one another.

Several of the software functions previously mentioned will now be discussed. In stepped sweep, Averaging 2811 computes the linear average of a block of data points taken while the frequency is held fixed. This is repeated for each frequency in the stepped sweep. In swept frequency sweeps Averaging 2811 computes the weighted exponential running average of the synchronous incoming data, and therefore decreases the input noise bandwidth, thereby reducing noise and extending dynamic range. Each time Averaging is restarted the averaging starts with a small averaging factor, increasing it every one to eight sweeps to the selected averaging factor, thus allowing fast convergence to the final value. Smoothing 2837 on the other hand operates on processed data by providing a linear moving average of adjacent data points as a percentage of the display. The result is like a video filter, reducing peak to peak noise such as on a baseline trace, but not improving the dynamic range of the signal. In addition, smoothing in the present invention has a novel use for group delay measurements. Group delay (i.e. $t_g$ =change in phase in degrees/(360 degrees * change in frequency in Hertz) is a differential measurement and unfortunately noise is therefore emphasized. Classically the frequency over which the group delay measurement is made, called aperture, is therefore increased to provide a more useful group delay measurement. In the present invention, this same result is achieved by smoothing the processed group delay data. Thus, smoothing (i.e., averaging of adjacent data points) of group delay data achieves the same effect as is achieved by utilizing a classical variable group delay aperture. This also allows a phase change greater than 180 degrees across the aperture when smoothing is applied to 3 or more adjacent data points.

The RF vector error correction in the present invention also is adapted to speed and facilitate calibration. Measurements are made on a series of calibration standards and then the Raw Array data 2809 is stored in the Error Array 2815. Many different types of calibration standards can be used including the openload-short approach as used in coaxial connectors, offset-shortload approach as used in waveguide technologies, and multiple offset shorts as used in microstrip devices. The calibration standards need not be used in any particular order since all data is stored digitally, and the display format which is updated in real time even during calibration, can be changed at any time without effecting the calibration itself. IF averaging can also be used during calibration since Averaging operates on the Raw Array 2809. Multiple fixed and sliding loads as desired can also be utilized. Since the correction data sets themselves are stored in memory, several correction data sets can be stored in the machine at one time (e.g., different correction data sets can be stored for different S-parameters and correction data sets over different frequency ranges can be stored for the same S-parameter). Because of the trace math 2831 and the memory array 2833, both corrected and uncorrected traces can be viewed and used at the same time.

Gating 2817 is used to look at certain portions of the display as specified by the user. Gating can be used either in the time or frequency domains and provides a gate through which the data can be viewed. This gate is selected by setting a center time and a span (or a start time and a stop time) about which to view the displayed data. When gates are desired, rather than removing time domain data outside of the gate from the data being used to calculate the displayed data, in the present invention the frequency domain shape of the gate is calculated and convolved directly with the same incoming frequency data as a frequency operation. The result is that no data is eliminated from within the gated region, and when the frequency to time transformation is performed there is no problem with undersampling of the bandlimited time data. The result is that the gated time domain data maintains its full spectrum of information and can be transformed back into the frequency domain if so desired, without loss of information. Thus, even though the user can perform the setting of gates while viewing the time domain data, the actual gating is performed in the frequency domain by means of convolution.

Electrical delay and reference plane extension 2821 are used, respectively, to change the electrical delay, for example in order to measure the electrical delay of an air line or to move the measurement plane used in S-parameter measurements to other than the physical plane of the test set ports 1 or 2. Although both electrical delay and reference plane extension are both defined in units of time (i.e., plus or minus up to 100 seconds) and both use the same mathematical formula, electrical delay varies per parameter while reference plane extension varies per port. An equivalent readout in distance is made along with the electrical delay.

Time Domain Processing

The usual microwave DUT 111 consists of multiple elements with transmission line sections in between. When tested using conventional frequency domain techniques, a composite response is generated. The specific discontinuities cannot be examined individually. In the time domain, the present invention takes its normal frequency domain data and applies for the first time the little known Chirp Z transform, as described by Rabiner and Gold in "Theory and Application of Digital Signal Processing", pages 393-398, 1975, to convert from the frequency to the time domain. The details of the time domain processing for the apparatus can be found in U.S. Pat. No. 4,636,717 with reference to FIGS. 30A-33D.

We claim:

1. A method of calibrating an RF network analyzer, comprising the steps of:
 selecting by a user of the network analyzer at least three calibrated RF standards having any known electromagnetic response characteristics;

communicating to the RF network analyzer by the user the known electromagnetic response characteristics of the calibrated RF standards chosen;

selecting by the user any arbitrary order for measuring the RF responses of said calibrated RF standards;

measuring with the RF network analyzer RF scattering parameters $S_{11}$, $S_{21}$, $S_{12}$, and $S_{22}$ of said calibrated RF standards in the order selected by the user;

storing data in a memory in the RF network analyzer which corresponds to said measured RF scattering parameters of said calibrated RF standards; and calculating vector error correction coefficients which are characteristic of systematic errors introduced by the RF network analyzer, into measured scattering parameters including dc offset, attenuation, signal directivity, tracking, and source match.

2. The method of claim 1 further comprising:

measuring with the RF network analyzer RF scattering parameters $S_{11}$, $S_{21}$, $S_{12}$, and $S_{22}$ of a device under test having unkown RF response characteristics;

correcting the measured RF responses of the device under test for systematic errors introduced by the RF network analyzer into the measured RF scattering parameters of the device under test using said vector error correction coefficients.

3. The method of claim 1 where the selection of at least three calibrated RF standards is made from the group consisting of an open; a short; a load; an imperfect open having known capacitance and offset characteristics; an imperfect short having known offset characteristics; a plurality of offset shorts; and an offset having a known offset delay, offset loss, and offset characteristic impedance.

* * * * *